United States Patent
Forbes et al.

(10) Patent No.: US 7,629,858 B2
(45) Date of Patent: *Dec. 8, 2009

(54) TIME DELAY OSCILLATOR FOR INTEGRATED CIRCUITS

(75) Inventors: Leonard Forbes, Corvallis, OR (US); David R. Cuthbert, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

This patent is subject to a terminal disclaimer.

(21) Appl. No.: 11/900,812

(22) Filed: Sep. 13, 2007

(65) Prior Publication Data

US 2008/0007359 A1    Jan. 10, 2008

Related U.S. Application Data

(63) Continuation of application No. 11/215,665, filed on Aug. 29, 2005, now Pat. No. 7,295,081.

(51) Int. Cl.
H03B 5/24 (2006.01)
H03L 7/24 (2006.01)

(52) U.S. Cl. ............. 331/135; 331/55; 331/108 B

(58) Field of Classification Search ............ 331/46, 331/55, 108 B, 135–137
See application file for complete search history.

(56) References Cited

U.S. PATENT DOCUMENTS

| | | | |
|---|---|---|---|
| 4,901,037 A * | 2/1990 | Feller | 331/109 |
| 5,148,125 A * | 9/1992 | Woodhead et al. | 331/135 |
| 5,652,549 A * | 7/1997 | Unterricker et al. | 331/57 |
| 6,107,893 A | 8/2000 | Forbes | |
| 6,249,191 B1 | 6/2001 | Forbes | |
| 6,373,740 B1 | 4/2002 | Forbes et al. | |
| 6,380,787 B1 | 4/2002 | Forbes | |
| 6,531,929 B2 | 3/2003 | Forbes | |
| 6,535,071 B2 | 3/2003 | Forbes | |
| 6,539,490 B1 | 3/2003 | Forbes et al. | |
| 6,552,564 B1 | 4/2003 | Forbes et al. | |
| 6,628,158 B2 | 9/2003 | Forbes | |
| 6,686,766 B2 | 2/2004 | Forbes et al. | |
| 6,737,926 B2 | 5/2004 | Forbes | |
| 6,772,362 B2 | 8/2004 | Forbes et al. | |
| 7,295,081 B2 * | 11/2007 | Forbes et al. | 331/135 |
| 2003/0043936 A1 | 3/2003 | Forbes | |
| 2003/0169087 A1 | 9/2003 | Forbes | |

OTHER PUBLICATIONS

U.S. Appl. No. 11/215,665, Non-Final Office Action mailed Mar. 13, 2007, 12 pgs.
U.S. Appl. No. 11/215,665, Notice of Allowance mailed Jun. 29, 2007, 4 pgs.

(Continued)

*Primary Examiner*—David Mis
(74) *Attorney, Agent, or Firm*—Schwegman, Lundberg & Woessner, P.A.

(57) ABSTRACT

One aspect relates to an oscillator, and various oscillator embodiments comprise an amplifier and line driver with an input and an output and a transmission line with a predetermined transmission signal time delay. The output is adapted to produce an inverted signal with respect to a signal received at the input. The transmission line has a first end connected to the output and a second end connected to the input. Other aspects and embodiments are provided herein.

24 Claims, 16 Drawing Sheets

OTHER PUBLICATIONS

U.S. Appl. No. 11/215,665, Response filed Jun. 11, 2007 to Non-Final Office Action mailed Mar. 13, 2007, 12 pgs.

Lee, T. H., "The Design of CMOS Radio-Frequency Integrated Circuits", Cambridge University Press,(1998),509-514.

Rabaey, J., et al., "Digital Integrated Circuits: A Design Perspective, 2nd Edition", *Prentice-Hall*, Upper Saddle River, NJ, 27-31.

Sedra, Adel S., et al., *Microelectronic Circuits, 5th Edition*, (2004),1174-1175.

Tzuang, Ching-Kuang C., et al., "LC-Free CMOS Oscillator Employing Two-Dimensional Transmission Line", *2003 IEEE International Frequency Control Symposium and PDA Exhibition Jointly with the 17th European Frequency and Time Forum*, (2003),487-489.

\* cited by examiner

"H"-TREE

GRID

BALANCED TREE

BALANCED TREE WITH BUFFERS

TIME DELAY OSCILLATOR FOR INTEGRATED CIRCUITS

This application is a continuation of U.S. application Ser. No. 11/215,665, filed Aug. 29, 2005, now U.S. Pat. No. 7,295,081 which is incorporated herein by reference in its entirety.

TECHNICAL FIELD

This disclosure relates generally to integrated circuits, and more particularly, to integrated circuit oscillators.

BACKGROUND

Common oscillators for electronics include voltage controlled oscillators, phase shift oscillators and ring oscillators. The voltage controlled oscillators and phase shift oscillators provide sine wave outputs.

FIG. 1 illustrates a voltage controlled oscillator 100, which is capable of providing a sine wave output. Voltage controlled oscillators use tuned or resonant LC circuits 101 (circuits with an inductor L and capacitor C) to establish the oscillation frequency. The illustrated CMOS (Complementary Metal Oxide Semiconductor) voltage controlled oscillator 100 has a resonant circuit 101 that includes two inductors and two capacitors. The two cross-coupled transistors 102A and 102B provide the power gain required to compensate for losses and provide a large output waveform. However, the fabrication of inductors in CMOS integrated circuits is problematic, as the inductors occupy large areas and have low quality (Q) factors due to losses in the silicon substrate. Thus, proposals to eliminate inductor(s) include a proposal to use an active circuit to emulate an inductor and to construct an inductorless circuit with a sharp frequency response, and a proposal to replace the inductor and capacitor with a transmission line. Voltage controlled oscillators are commonly used in radio frequency CMOS integrated circuits in cellular phones and other applications.

FIG. 2 illustrates a phase shift oscillator, which also is capable of producing a sine wave output. Phase shift oscillators have been used in electronic instruments due to their simplicity, and recently have been proposed for use in CMOS circuits. The illustrated phase shift oscillator 200 uses an RC network 201 (circuit network with resistors R and capacitors C) to provide a 180° phase shift at the oscillation frequency to the input of the inverter 203, as well as a desired gain. The resistor and capacitor labels R and C are not intended to imply particular values for the resistors and capacitors or that all of these resistors have the same value and all of these capacitors have the same value.

FIG. 3 illustrates ring oscillator 300. Clock generators in digital circuits commonly use ring oscillators with large and nearly square wave outputs. The illustrated ring oscillator includes a network 301 with an odd number of inverters 303 connected in series. At least three inverters are used to insure a full voltage swing. The oscillation frequency is determined by the propagation or signal delay of the inverters. The frequency of oscillation is lowered by using additional inverters. For a given number of inverter stages (N) and inverter propagation delay ($T_{PROP}$) for each inverter stage 303, the oscillation frequency (f), which includes both a falling and rising edge, can be represented by the equation:

$$f = \frac{1}{2NT_{PROP}}. \tag{1}$$

The inverters 203 and 303 illustrated in FIGS. 2 and 3 are CMOS inverters, such as illustrated at 403 in FIG. 4, for example.

DETAILED DESCRIPTION

Figure 1:
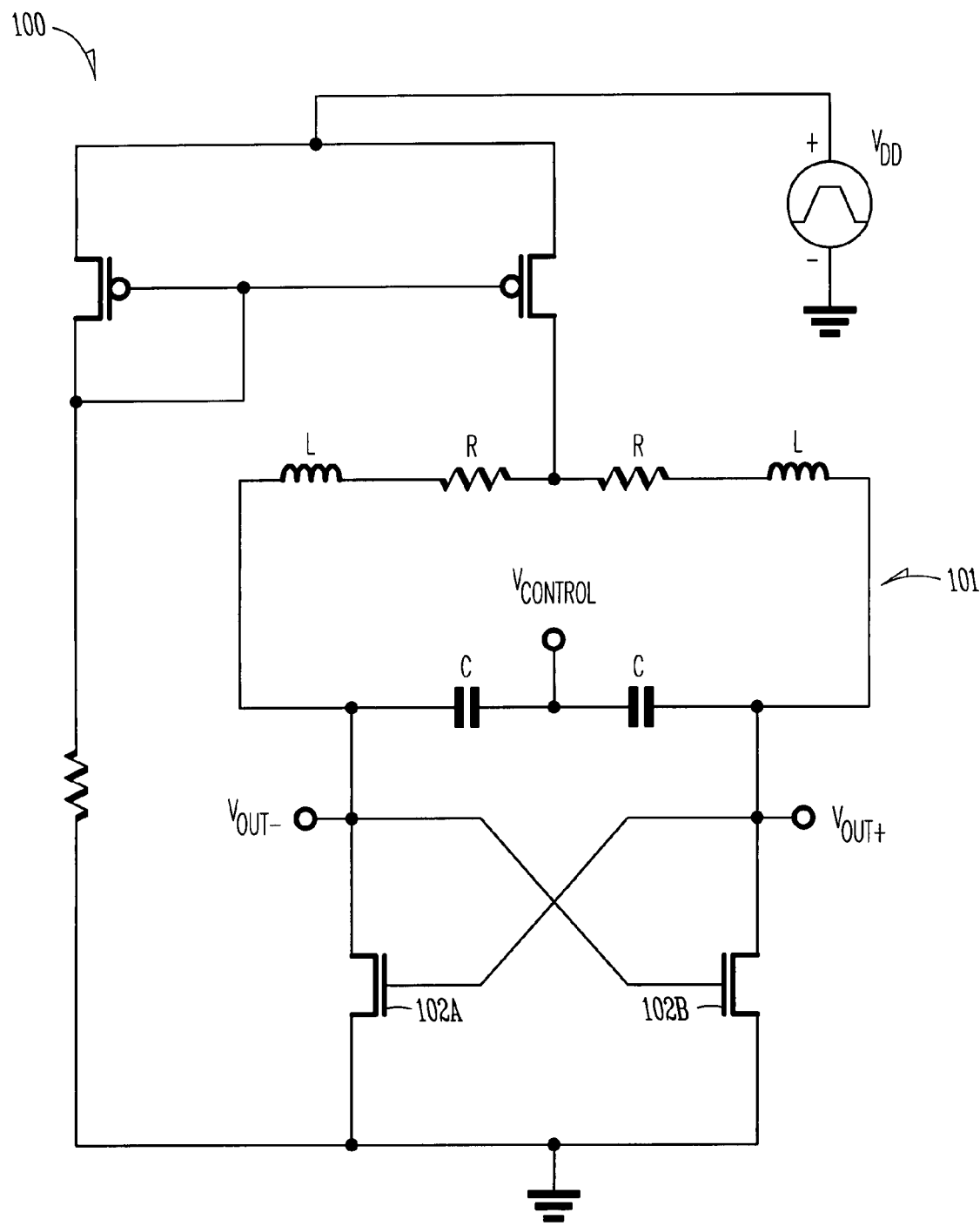
FIGS. 1-3 illustrate types of oscillators used in electronics.
Figure 2:
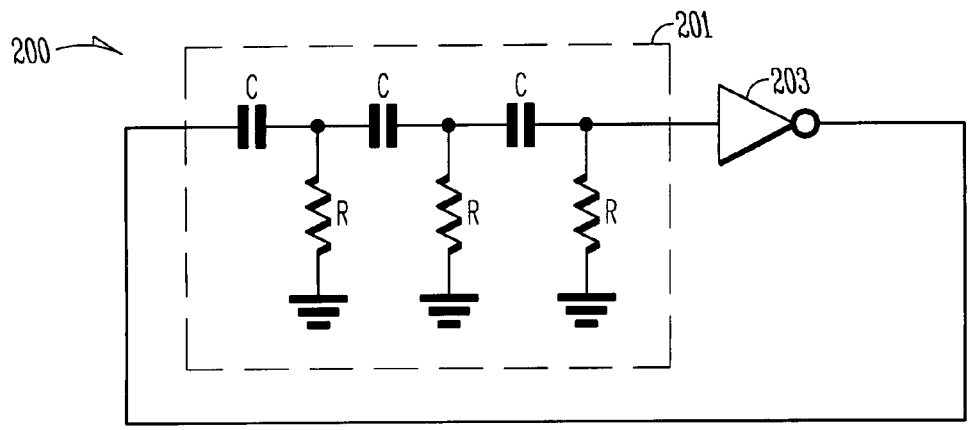

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. Other embodiments may be utilized and structural, logical, and electrical changes may be made without departing from the scope of the present invention. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

Various oscillator embodiments comprise an amplifier and line driver with an input and an output and a transmission line with a predetermined transmission signal time delay. The output is adapted to produce an inverted signal with respect to a signal received at the input. The transmission line has a first end connected to the output and a second end connected to the input.

Various oscillator embodiments comprise a transmission line with a predetermined transmission signal time delay where the transmission line has a first end and a second end, a driver with an output connected to the first end of the transmission line, a receiver with an input connected to the second end of the transmission line and an output connected to the input of the driver. One of the driver and the receiver includes a non-inverting amplifier and the other of the driver and the receiver includes an inverting amplifier.

Various oscillator embodiments comprise a transmission line with a predetermined transmission signal time delay where the transmission line has a first end and a second end, a first NMOS transistor and a second NMOS transistor. The first NMOS transistor has a gate connected to the second end of the transmission line and connected to a ground potential through a first resistor, a source connected to the ground potential, and a drain connected to a power supply line through a second resistor. The second NMOS transistor has a gate connected to the drain of the first NMOS transistor, a drain connected to the power supply line, and a source connected to the first end of the transmission line and to the ground potential.

According to an embodiment of a method of forming an oscillator, an amplifier and line driver circuit is formed with an input and an output where the output is adapted to produce an inverted signal with respect to a signal received at the input. A transmission line is formed with a predetermined transmission signal time delay. The transmission line has a first end connected to the output and a second end connected to the input.

According to an embodiment of a method for producing a clock signal of a predetermined oscillation, a signal is driven into a first end of a transmission line with a predetermined transmission signal time delay, a delayed signal is received from a second end of the transmission line, and upon receiving the delayed signal, an inverted signal is driven into the first end of the transmission line.

Figure 3:
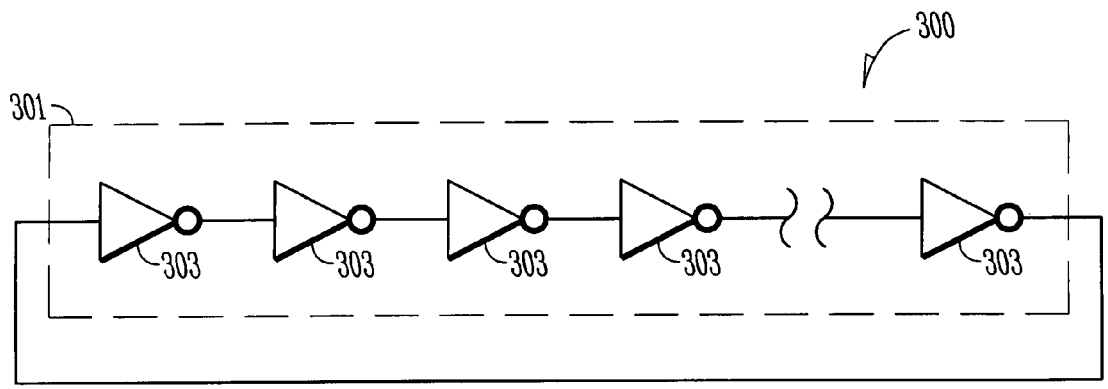

The present subject matter relates to a propagation time delay oscillator that uses the propagation time delay on an integrated circuit transmission line to establish the oscillation period, rather than using the propagation or signal time delay associated with inverters, such as illustrated in FIG. 3. The present subject matter uses an inverting amplifier and line driver with a transmission line connected between an output and an input of the driver. The transmission line has a predetermined time delay used to determine the oscillation of the driver output. For example, one embodiment uses a non-inverting transmission line driver connected to a first end of the transmission line and a single inverter, also referred to as an inverting amplifier, connected to a second end of the transmission line and connected to the driver. Since the characteristic impedance of transmission lines is small, a source-follower transistor can be used as a low output impedance line driver. For a given propagation time delay down the transmission line ($TL_{TD}$), the oscillation frequency (f) is provided by the equation:

$$f = \frac{1}{2(TL_{TD})}. \quad (2)$$

In comparison to Equation 1 for the ring oscillator, where the time delay is determined based on the number of inverters, the time delay for the present subject matter is determined by the length of the transmission line and the speed of electromagnetic propagation in the dielectric material used as an insulator in the integrated circuits. A common dielectric material is silicon oxide with a dielectric constant of about 4. As will be developed below, the speed of the electromagnetic radiation through a transmission line within silicon oxide is about one half the speed of light or about $1.5 \times 10^{10}$ cm/sec in a vacuum. Thus, a one centimeter long line in silicon oxide results in a 70 picosecond signal propagation delay, which corresponds to an oscillation period of 140 picoseconds and an oscillation frequency of about 7 GHz. Additionally, it is noted with respect to the ring oscillator of FIG. 3 that the ability to adjust the oscillator frequency is limited to incremental time delay values associated with the time delay of each of the inverter stages. In contrast the present subject matter is able to finely adjust the oscillation frequency by adjusting the length of the transmission line.

Transmission Line Signals

Figure 4:
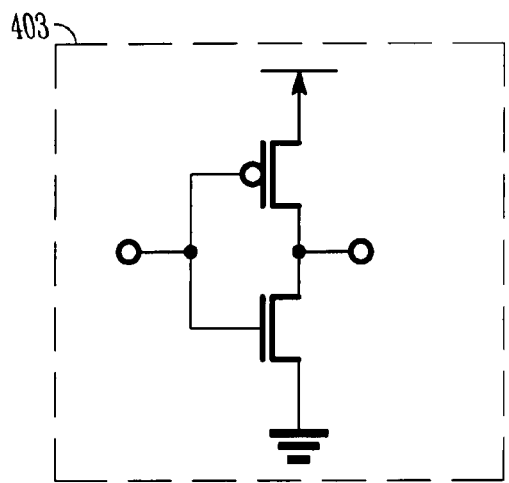
FIG. 4 illustrates an inverter used in the oscillators of FIGS. 2-3.
Figure 5:
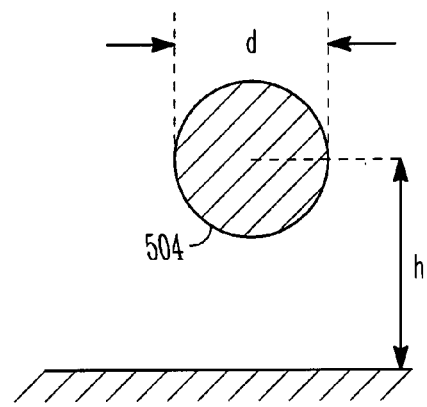
FIG. 5 illustrates a transmission line with a circular cross-section above a ground plane.
Figure 6:
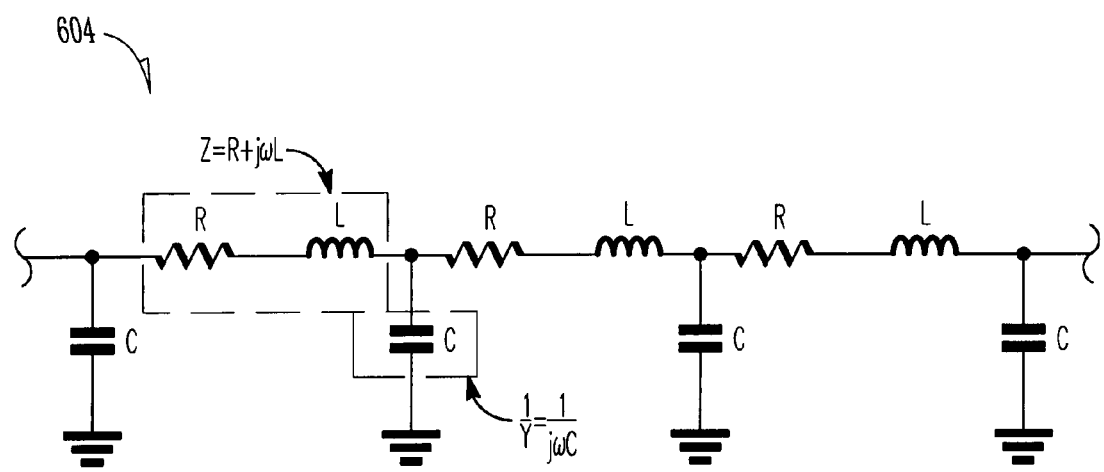
FIG. 6 illustrates an integrated circuit interconnection represented as a transmission line.

Signals on long interconnection lines in integrated circuits are most conveniently analyzed using transmission line equations and techniques or by circuit simulations. FIG. 5 illustrates a transmission line 504 with a circular cross-section above a ground plane, and FIG. 6 illustrates an integrated circuit interconnection represented as a transmission line 604. The illustrated transmission line includes an inductance L and resistance R in series that provide an impedance $Z = R + j\omega L$. The transmission line also includes a shunt capacitance C that provides an admittance $Y = j\omega C$. As is conventional in transmission line models, the resistive, inductive and capacitive components are distributed along the line, as modeled by a plurality of resistors R, inductors L and capacitors C. The capacitance for the line illustrated in FIG. 4 is:

$$C = 2\pi \varepsilon_r \varepsilon_0 \ln\left(\frac{4h}{d}\right), \quad (3)$$

where $\varepsilon_0$ represents the electric permittivity of free space and $\varepsilon_r$ represents the relative permittivity, or dielectric constant, of the insulator. The inductance for the line illustrated in FIG. 4 is:

$$L = \frac{\frac{1}{2\pi}\mu_0}{\ln\left(\frac{4h}{d}\right)}, \quad (4)$$

where $\mu_0$ is the magnetic permittivity of free space.

The characteristic impedance of the line is:

$$Z_0 = \sqrt{\frac{Z}{Y}} = \sqrt{\frac{r+j\omega L}{j\omega C}}, \quad (5)$$

which for an ideal lossless line without resistance R becomes:

$$Z_0 = \sqrt{\frac{L}{C}} = \frac{1}{2\pi}\sqrt{\frac{\mu_0}{\varepsilon_r \varepsilon_0}} \frac{1}{\ln\left(\frac{4h}{d}\right)}, \quad (6)$$

and the propagation constant is:

$$\gamma = \sqrt{ZY} = j\omega\sqrt{LC} = j2\pi f \sqrt{LC} \quad (7)$$

$$\sqrt{LC} = \sqrt{\mu_0 \varepsilon_r \varepsilon_0} = \frac{1}{v}, \quad (8)$$

where v represents the velocity of the transmission signal.

One important consideration in transmission line analysis is the length of the line (l) and the product of the propagation constant ($\gamma$) ($\gamma l$), where:

$$\gamma l = j2\pi \frac{f}{v} l = j2\pi \frac{l}{\lambda}, \quad (9)$$

as the velocity (v) is represented by the product of the frequency (f) and the wavelength ($\lambda$):

$$f\lambda = v. \quad (10)$$

Thus, substituting for the velocity (v) in Equation 10 results in Equation 11:

$$\gamma l = j2\pi \frac{l}{\lambda} \quad (11)$$

For a wire above a conductive plane, the velocity of the electromagnetic radiation on the line is:

$$v = \frac{1}{\sqrt{LC}} = \frac{1}{\sqrt{\mu_0 \varepsilon}}, \quad (12)$$

where $\mu_0$ is the magnetic permeability of free space and $\varepsilon = \varepsilon_r \varepsilon_0$ is the electric permittivity of the dielectric insulator. The electric permittivity of free space is $\varepsilon_0$ and the relative permittivity or dielectric constant of the insulator is $\varepsilon_r$. The velocity of light in free space is:

$$v = \frac{1}{\sqrt{\mu_0 \varepsilon_0}} = 3.0 \times 10^{10} \text{cm/sec}. \quad (13)$$

In the case where the insulator is a silicon oxide dielectric with a relative permittivity or dielectric constant of about 4, then the velocity is estimated by equation 14:

$$v = \frac{1}{\sqrt{\mu_0 \varepsilon_0 \varepsilon_r}} = \frac{1}{\sqrt{\mu_0 \varepsilon_0 4}} = 1.5 \times 10^{10} \text{cm/sec}. \quad (14)$$

The characteristic impedance of free space is:

$$Z_0 = \sqrt{\frac{L}{C}} = \sqrt{\frac{\mu_0}{\varepsilon_0}} = 377 \text{ ohms}. \quad (15)$$

For an ideal lossless line, with reference to Equation 6, if the geometrical factor ln(4h/d) is around one or the line is close to the ground plane h=0.7 d, the impedance will be about:

$$Z_0 = \frac{377}{2\pi} = 60\Omega. \quad (16)$$

The characteristic impedance is further reduced if the transmission line is in a dielectric medium. The reduction is inversely proportional to the square root of the dielectric constant. Thus, a silicon oxide dielectric, with a dielectric constant of about 4, reduces the impedance by a factor of about two such that the characteristic impedance is about 30Ω. High K dielectrics would reduce the impedance by more than a factor of two.

However, interconnection lines in integrated circuits are not ideal lossless lines but have significant resistance. Thus, a more accurate analysis uses equations for lossy lines or circuit simulations. For a long line, the characteristic impedance is:

$$Z_0 = \sqrt{\frac{Z}{Y}} = \sqrt{\frac{R+j\omega L}{j\omega C}}, \quad (17)$$

and the propagation constant is:

$$\gamma = \sqrt{ZY} = \sqrt{(R+j\omega L)(j\omega C)}. \quad (18)$$

A technique disclosed in U.S. Pat. Nos. 6,552,564 and 6,686,766, which are herein incorporated by reference in their entirety, minimizes the rise time for square wave signals and reduces reflections and ringing on lines with a high impedance termination by forming a line with a desired resistance. An analysis of circuit models using SPICE, a circuit simulation program, indicates that a desired resistance is:

$$R = \sqrt{4\frac{L}{C}}. \quad (19)$$

Figure 7:
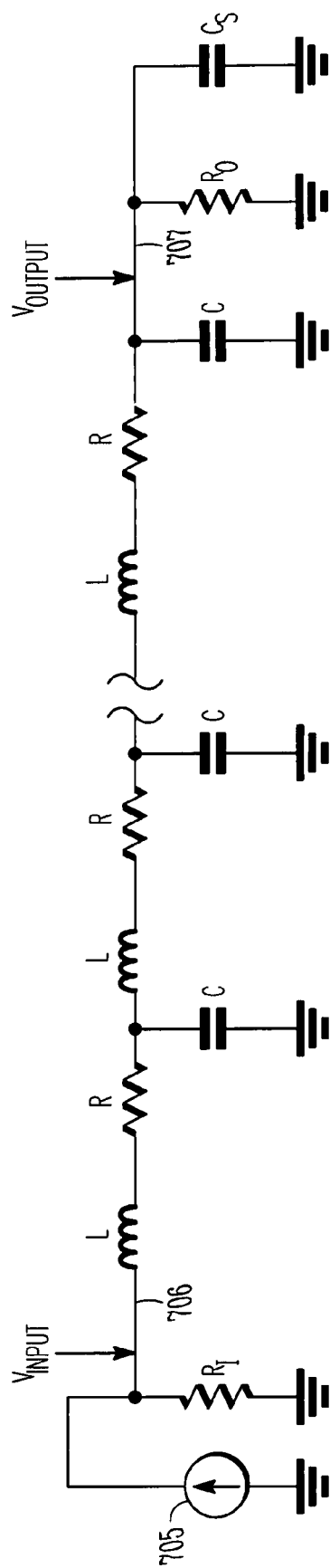
FIG. 7 illustrates a lossy transmission line used to illustrate wave reflections, as discussed in FIGS. 8-11.

FIG. 7 illustrates a lossy transmission line used to illustrate wave reflections, as discussed in FIGS. 8-11. The sending end is terminated in the characteristic impedance of the line ($R_1=Z_0=32\Omega$ for an ideal transmission line in silicon oxide when ln(4h/d) is approximately equal to one), but the receiving end is terminated by a high impedance ($R_0=10\,k\Omega$) which approximates an open circuit termination. Open circuit terminations normally result in a lot of reflections and ringing, except that here the line is designed to have a resistance to reduce reflections and ringing without unduly slowing the transition time for square signals.

A signal generated by signal source 705 is transmitted along the long interconnection line from node 706 to node 707. Due to a small capacitance $C_S$ (characteristic of a capacitance associated with a transistor gate), the signal reflects back towards the input. The reflected signal is received back at node 706, and depending on the impedance, the reflected signal will either be reflected again back towards node 707, or there will be no reflection at all.

One technique to minimize the reflected signal from 707 to 706 to prevent those same reflected signals from being re-reflected back to node 707 matches the source impedance to the line impedance $Z_0$. However, many signal sources have drivers which have a low impedance which will therefore cause a large reflection at node 706. Also, since reflections at the receiving end 707 are an inherent feature of CMOS circuits, a better solution is to attenuate the reflected signals before they reflect again at node 707. Thus, the reflected signals from the source end 706 must be minimized.

If the long interconnection lines are driven with a large channel width CMOS driver, which has a low output impedance, then it can be shown that a preferred choice would be for the resistance R of the line to be equal to or approximately equal to $(4L/C)^{1/2}$, where L is the inductance of the line and C is the capacitance of the line. This is further explained with reference to FIGS. 8-10.

Figure 8:
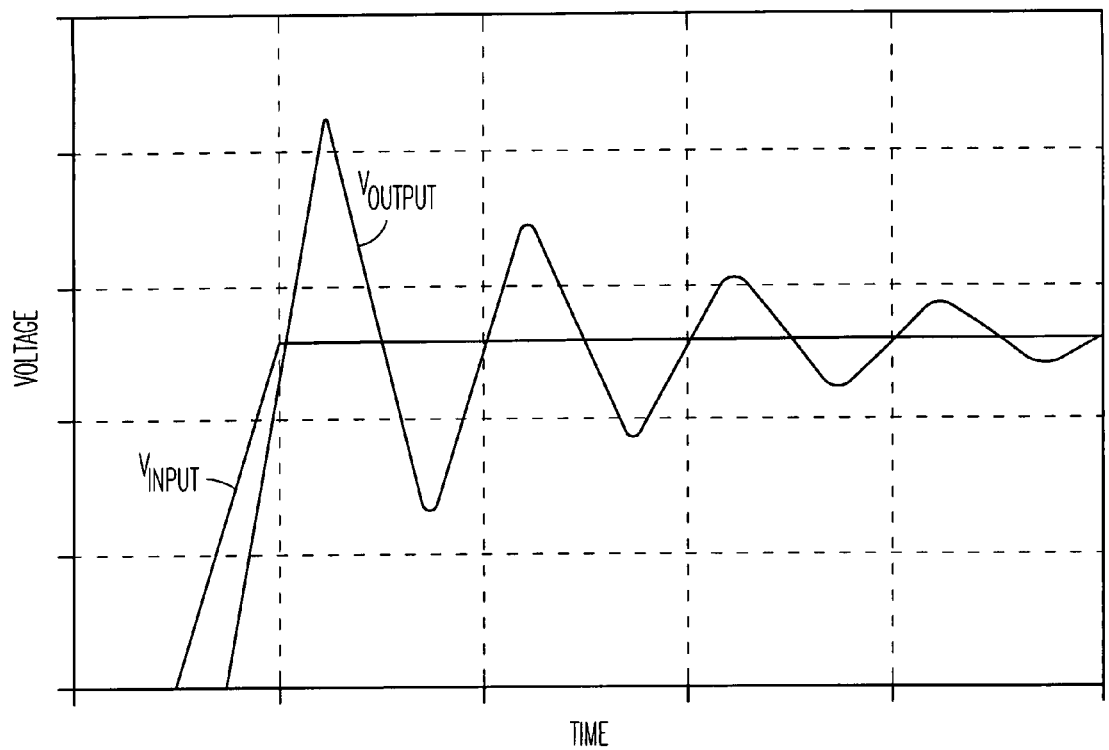
FIGS. 8-10 illustrate an under-damped, over-damped, and critically-damped system, respectively.
Figure 9:
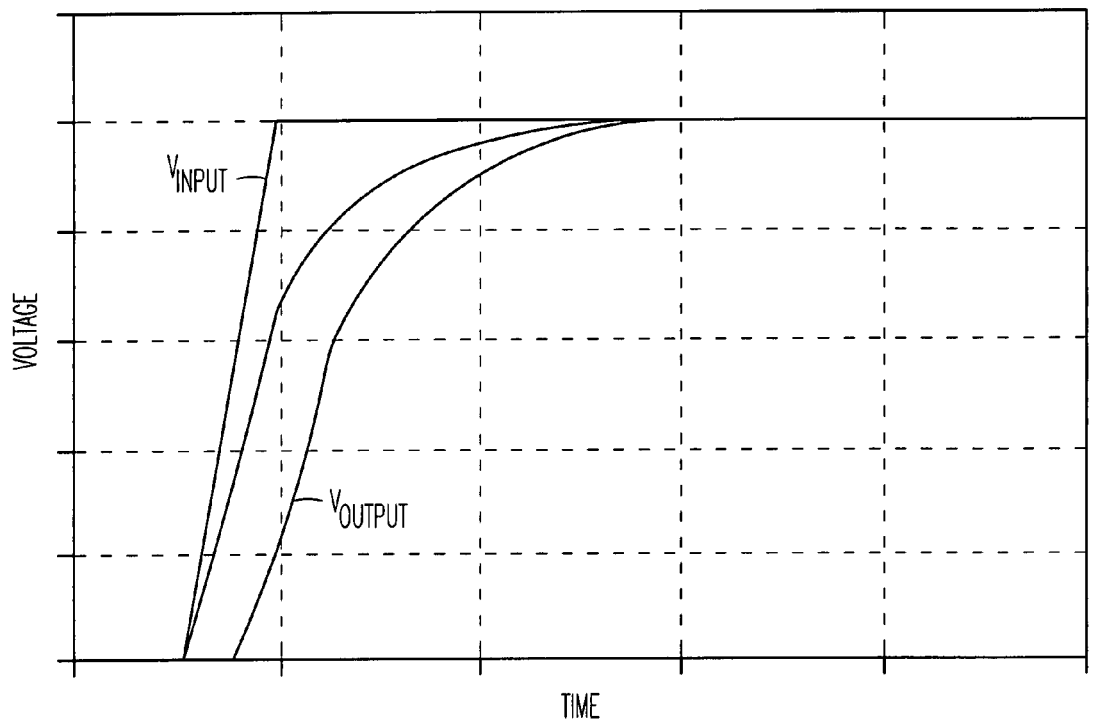
Figure 10:
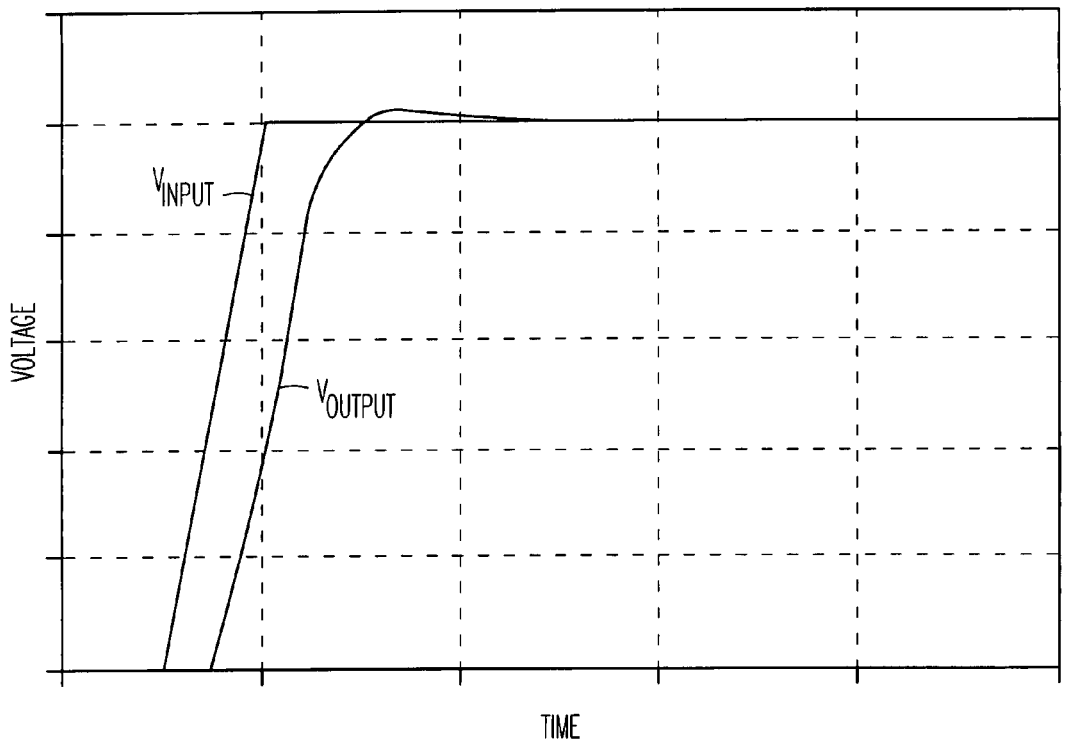

FIGS. 8-10 illustrate an under-damped, over-damped, and critically-damped system, respectively. Specifically, FIGS. 8-10 display the reading of the signal $V_{OUTPUT}$, at node 707, as compared to the input signal $V_{INPUT}$ for the interconnection line circuit of FIG. 7.

FIG. 8 represents the case where there are reflections at the source end, node 706 in FIG. 7, and where the resistance of the interconnection line is small, so that there is not much attenuation of the reflected signal before it reaches node 707 in FIG. 7. $V_{OUTPUT}$ rises quickly but oscillates or rings around the high potential of the input signal $V_{INPUT}$, which is characteristic of an under-damped system.

FIG. 9 represents the case where the reflections are minimized at the source end, node 706 in FIG. 7, by having considerable signal attenuation down the interconnection line by having a large line resistance. The rise of the signal $V_{OUTPUT}$ is significantly delayed and slow as compared to the input signal $V_{INPUT}$, which is characteristic of an over-damped system.

FIG. 10 represents the case where there are reflections at the source end, node 706 in FIG. 7, but there is sufficient attenuation of the reflected signals before they are received at node 707. Therefore, this system has a sufficient line resistance to prevent the reflected signals from being sent all the way back to node 707. The resistance R of the interconnection line is equal or approximately equal to $(4L/C)^{1/2}$, where L is the inductance of the line and C is the capacitance of the line. The output signal $V_{OUTPUT}$ is delayed by the time it takes to travel down the interconnection line, but the signal follows the input signal $V_{INPUT}$ fairly closely, which is characteristic of a critically-damped system. A circuit with an interconnection line which has a resistance which creates a critically damped system acts to minimize the ringing and reflections received at the destination end, without excessively delaying the signal transition. The geometry of the line includes the line length and cross sectional area. The resistance R of the line is dependant upon the resistivity r, line length l and cross sectional area A of the line, as shown in equation 20:

$$R = \frac{rl}{A}. \quad (20)$$

The line resistance can be adjusted to provide the desired resistivity to create a critically-damped system. By knowing the interconnection line resistivity and the source output impedance of a circuit, a resistance R can be determined which will insure high signal quality with minimal delay. In order to obtain the line resistance R, the interconnection line can be altered by changing the interconnection line resistivity r, length l, and/or cross sectional area A. For example, this technique can be used to find the required resistance R of the interconnection line and to find the required length l of the line, which according to the present subject matter is based on the desired time delay of a transmission line to provide a desired oscillator frequency. Then the resistivity and cross sectional area A of the interconnection line are selected or modified to satisfy the line relationship, which will produce an interconnection line which maintains signal quality by minimizing ringing and reflections, as discussed above.

Figure 11:
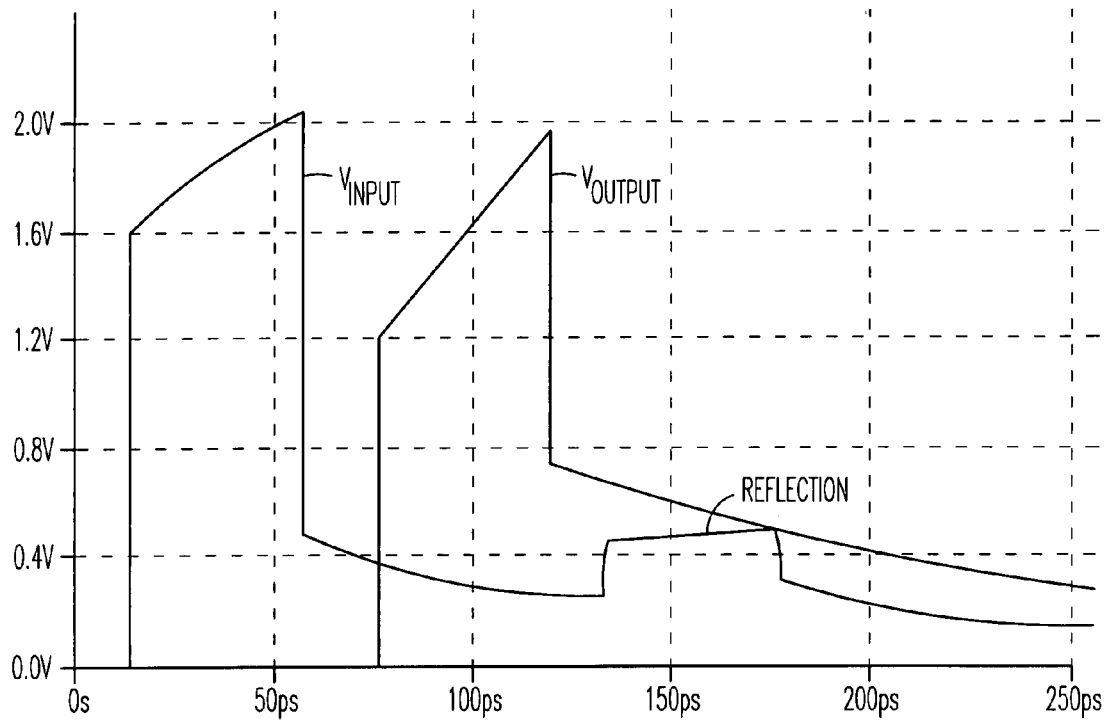
FIG. 11 illustrates a critically-damped waveform according to an aspect of the present subject matter.

FIG. 11 illustrates a critically-damped waveform. The input signal $V_{INPUT}$ is a pulse 50 picoseconds wide, and the same approximate pulse appears at the receiving end of the line but delayed by about 63 picoseconds. The reflection from the receiving end appears at the sending end $V_{INPUT}$ after a delay of another 63 picoseconds, but the magnitude is very small due to the attenuation in the lossy line. The attenuation of the line is designed to reduce these signals to small levels to prevent reflections and ringing at the receiving end. This is the kind of lossy delay line which will be used to provide signal delay in the oscillator circuit according to the present subject matter. The period of the oscillation is determined by the time delay on the transmission line.

Time Delay Oscillator

Digital integrated circuits, such as processors, communication circuits, logic arrays, and memory arrays, typically include multiple logic elements, with the timing of operation of each logic element controlled by a clock signal. It is common for an integrated circuit chip to have one central clock generator, with the signal from the clock generator being distributed around the integrated circuit via clock-line interconnects. High frequencies can be problematic in distributing clock signals, because the time delay of the clock signal across the circuit on interconnection lines becomes comparable to the period of oscillation. All locations have different timing signals rather than a well-defined timing signal at each location on the circuit.

An important consideration in the design of synchronous digital integrated circuits, and in particular those using pipelined architecture, is variation in the arrival times of clock signals at the clock inputs of the various logic elements. Variation in clock signal arrival time is referred to as clock skew, which is primarily a function of two parameters: the loading presented by clocked circuits and the RC delay of the clock line. Factors that affect the clock skew are the resistance, capacitance and inductance of the interconnection wires. Since the wires are not ideal conductors, different lengths of the wires carrying clock signals can result in different clock skews. Clock skew adds to cycle times, reducing the clock rate at which a chip can operate. Typically, skew should be 10 percent or less of a chip's clock cycle, meaning that for a 100 MHz clock, skew must be 1 nanosecond or less. High performance microprocessors may require skew to be 5 percent of the clock cycle, or 100 picosecond at a 500 MHz clock rate.

Figure 12:
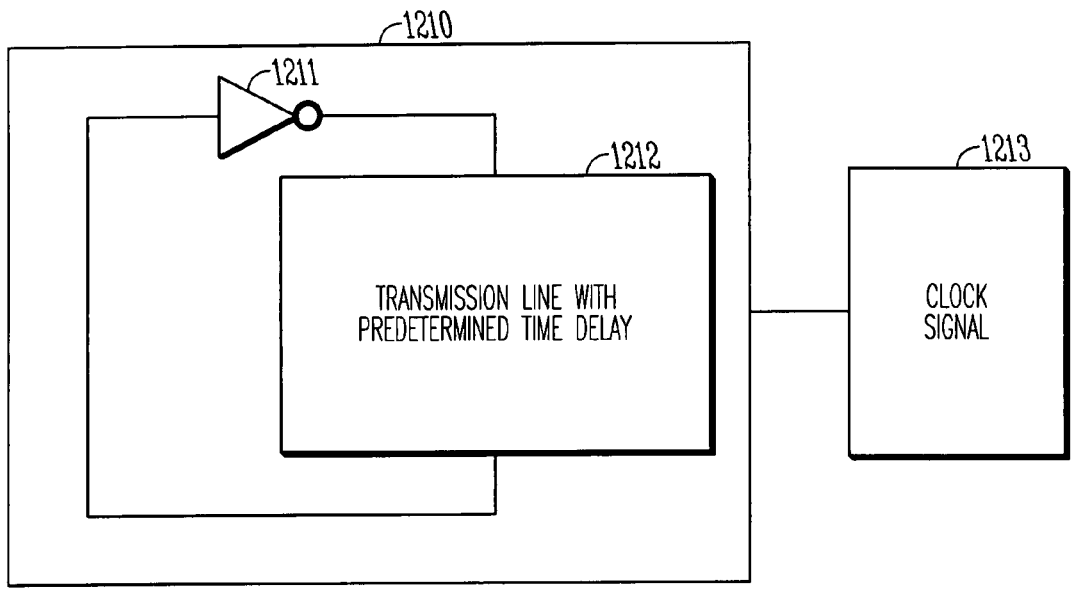
FIG. 12 illustrates an embodiment of a clock system with a time delay oscillator.

FIG. 12 illustrates an embodiment of a clock system with a time delay oscillator 1210. The oscillator includes an amplifier and line driver 1211 with an input and an inverted output, and includes a transmission line with a predetermined time delay 1212 connected between the output and the input of the amplifier and line driver 1211. The clock signal or signals can be taken from various nodes associated with the driver 1211 or along various point(s) along the transmission line. The oscillation frequency of the oscillator 1210 can be adjusted by adjusting the signal transmission time delay on the transmission line. For a given fabrication process that produces a transmission line of a given propagation constant, one method to adjust the time delay is to adjust the length of the transmission line. This adjustment can be performed at the time of the circuit design and fabrication. Some embodiments use programmable elements, such as programmable fuses and antifuses, to adjust the length of the transmission line, and the corresponding time delay, to achieve a desired oscillation frequency. Such fine tuning may be desirable due to some variance in transistor fabrication which may affect the propagation time through the driver 1211, for example. The output of the oscillator is clock signal 1213.

Figure 13A:
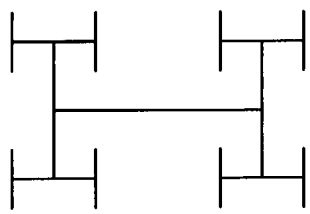
FIG. 13A illustrates an H-tree clock distribution.
Figure 13B:
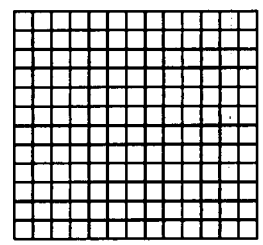
FIG. 13B illustrates a clock grid clock distribution structure.
Figure 13C:
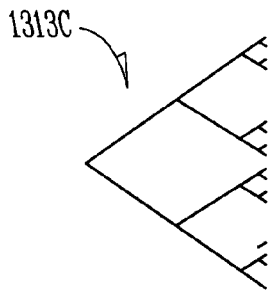
FIG. 13C illustrates a balanced tree clock distribution structure, and FIG. 13D illustrated a balanced tree clock distribution structure with buffers.
Figure 13D:
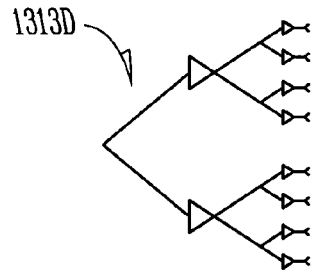

A variety of techniques have been used in conventional clock distribution systems to provide clock connections that are symmetrical and all of the same length, in order to minimize clock skew at the various logic elements. FIG. 13A illustrates an H-tree clock distribution 1313A, which is used primarily in custom layouts and has varying tree interconnect segment widths to balance skew throughout the chip. FIG. 13B shows a grid clock distribution structure 1313B. The grid is a simple clock distribution structure, having the advantage of being easy to design for low skew. However, the grid is an inefficient use of semiconductor area, and is power hungry because of the large amount of clock interconnect. Nevertheless, some chip vendors are using this clock structure for microprocessors. FIG. 13C depicts a balanced tree clock distribution structure 1313C. The balanced tree is the clock distribution structure used in high performance chips. In order to carry current to the branching segments, the clock line is widest at the root of the tree and becomes progressively narrower at each branch. As a result, the clock line capacitance increases exponentially with distance from the leaf cell (clocked element) in the direction of the root of the tree (clock input). Moreover, additional chip area is required to accommodate the extra clock line width in the regions closer to the root of the tree. As shown in FIG. 13D, buffers may be added at the branching points of the balanced tree structure. Adding buffers at the branching points of the tree significantly lowers clock interconnect capacitance, because it reduces the clock line width required toward the root.

Figure 14:
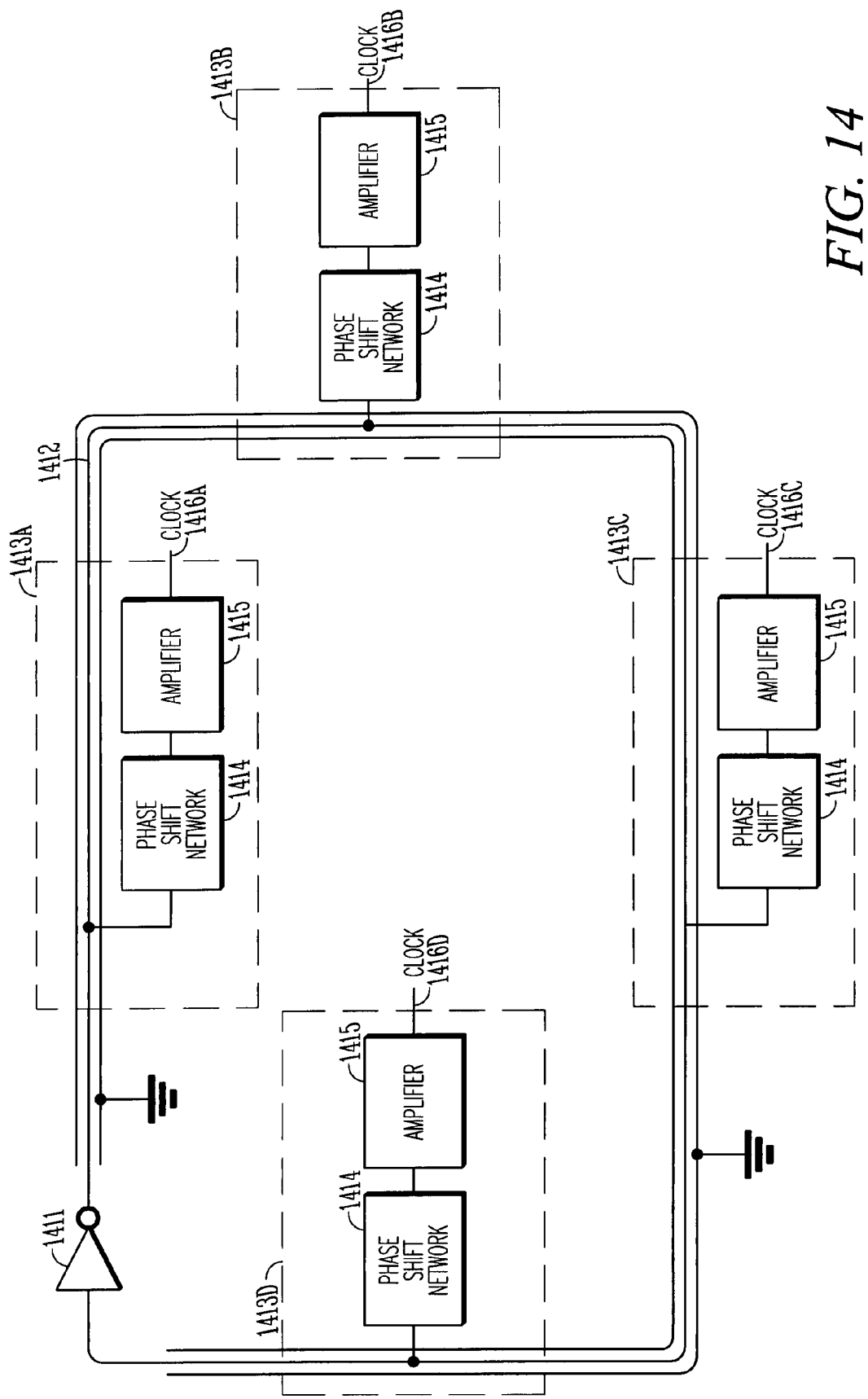
FIG. 14 illustrates an embodiment of a clock system with a time delay oscillator, in which the clock distribution includes taps along the transmission line.

FIG. 14 illustrates an embodiment of a clock system with a time delay oscillator, in which the clock distribution includes taps along the transmission line. Since the input impedance to CMOS transistors is high, they present only a small capacitive load. Thus, as shown in FIG. 14, the low impedance transmission line can be tapped at various locations as the line runs around an integrated circuit. This will provide timing signals with a well-controlled frequency at remote locations on an integrated circuit and can be used as a clock distribution system rather than a conventional clock tree or "H" tree distribution system The signal delay at each of the locations is well known and controlled by the length of the line to that particular location. This delay can be compensated for at each specific location, as illustrated by the phase shift network. This provides accurate timing signals with a well-controlled frequency at remote locations on an integrated circuit.

The illustrated system in FIG. 14 includes an amplifier and line driver 1411 with an input and inverted output, a transmission line 1412 of a predetermined transmission delay connected between the output and the input of the driver 1411, and four clock taps 1413A, 1413B, 1413C, and 1413D off of the transmission line. Thus, the illustrated embodiment uses the time delay transmission line itself to distribute the clock signal within the integrated circuit rather than, or in addition to, other clock distribution mechanisms. The phase of the transmission line signal at tap 1413A is different from the phase of the transmission line signal at tap 1413B, both of which are different from the phase of the transmission line signal at tap 1413C, all of which are different from the phase of the transmission line signal at tap 1413D. In order to provide synchronous clocks at each of the taps, the phase of the signals are adjusted using a phase shift network 1414. An amplifier 1415 is connected to the phase shift network to provide a signal capable of being driven on a clock line. The phase shift network uses an appropriate RC network to change the phase. For example, the phase can be adjusted by various degrees to be in a desired phase, can be adjusted by various degrees to be 180° with respect to the desired phase and then inverted to be in the desired phase, or can be inverted and then adjusted by various degrees to be in the desired phase. Since the time delay on the transmission line is well-understood, it is possible to determine the appropriate RC network for each phase shift network along the transmission line. Some embodiments provide a means to adjust an RC network to tune the phase using, for example, a voltage-controlled resistor.

Figure 15:
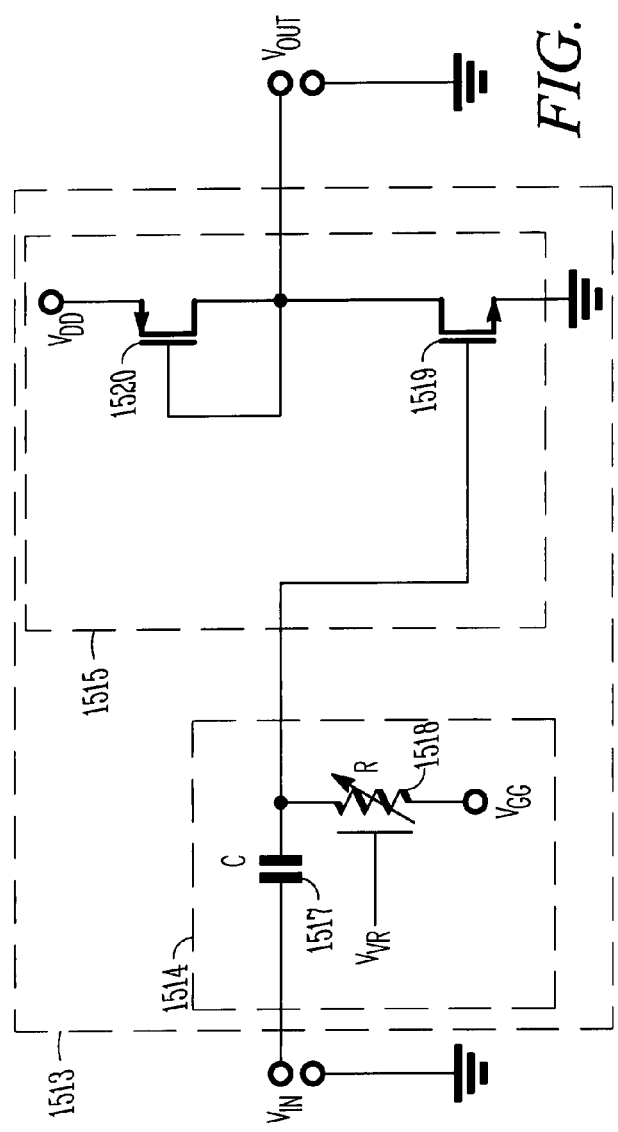
FIG. 15 illustrates an embodiment of a clock tap, such as illustrated in FIG. 14.

FIG. 15 illustrates an embodiment of a clock tap, such as illustrated at 1413A-D in FIG. 14. The illustrated clock tap includes a phase shift network 1514 and an amplifier 1515. By using CMOS elements in each amplifier stage 1515, each amplifier stage has a finite input capacitance and low gain, wide bandwidth, and low output impedance. The illustrated phase shift network 1514 is a high pass filter RC network made up of capacitor 1517 having capacitance C and a resistor 1518 having resistance R. The resistor is an NMOS transistor configured as a voltage variable resistor. Input voltage $V_{IN}$ is connected to a first terminal of capacitor 1517. A second terminal of capacitor 1517 is connected to the drain of NMOS transistor 1518. The gate of NMOS transistor 1518 is connected to voltage $V_{VR}$, which can be varied to adjust the value of resistance R. Gate bias supply voltage $V_{GG}$ is connected to the source of NMOS transistor 1518, and adjusts the level of the DC gate bias voltage provided to the gate of NMOS transistor 1519 in the amplifier network 1515. The amplifier network 1515 includes an NMOS transistor 1519 and a PMOS transistor 1520. The PMOS transistor 1520 is a diode-connected transistor, which has its gate and drain tied together. A voltage $V_{DD}$ is connected to the source of PMOS transistor 1520. The value of $V_{DD}$ is selected to optimize the performance of PMOS transistor 1520 and may be, for example, a few times larger than the value of $V_{GG}$. The source of NMOS transistor 1519 is grounded, and the drain of NMOS transistor 1519 is connected to the gate and drain of PMOS transistor 1520. The output voltage $V_{OUT}$, which is the output of amplifier network 1515, is taken from this point as well.

The frequency domain behavior of phase shift network 1514 is described by the transfer function:

$$H(s) = \frac{R}{R + \frac{1}{sC}} = \frac{1}{1 + \frac{1}{sRC}}, \quad (21)$$

where R and C are the resistance 1518 and capacitance 1517 of the phase shift network 1514, as described above, and s=jω with j being the square root of −1 and ω being the radian frequency.

The gain of the phase shift network 1514 is then:

$$|H(s)| = \frac{\omega RC}{\sqrt{1 + (wRC)^2}}, \quad (22)$$

and the phase angle of the phase shift network 1514 is:

$$H(s) = \frac{90°}{\tan^{-1}(\omega RC)} = 90° - \tan^{-1}(\omega RC). \quad (23)$$

Figure 17:
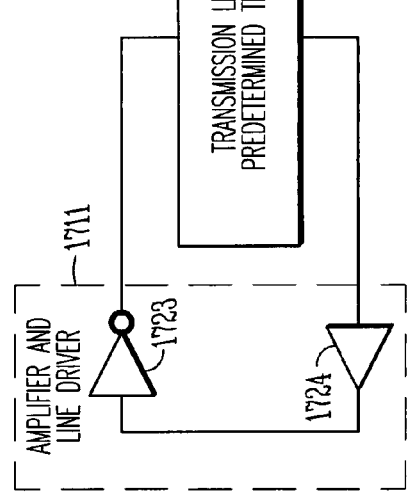
FIGS. 16 and 17 illustrate embodiments of an amplifier and line driver within a time delay oscillator.
Figure 16:
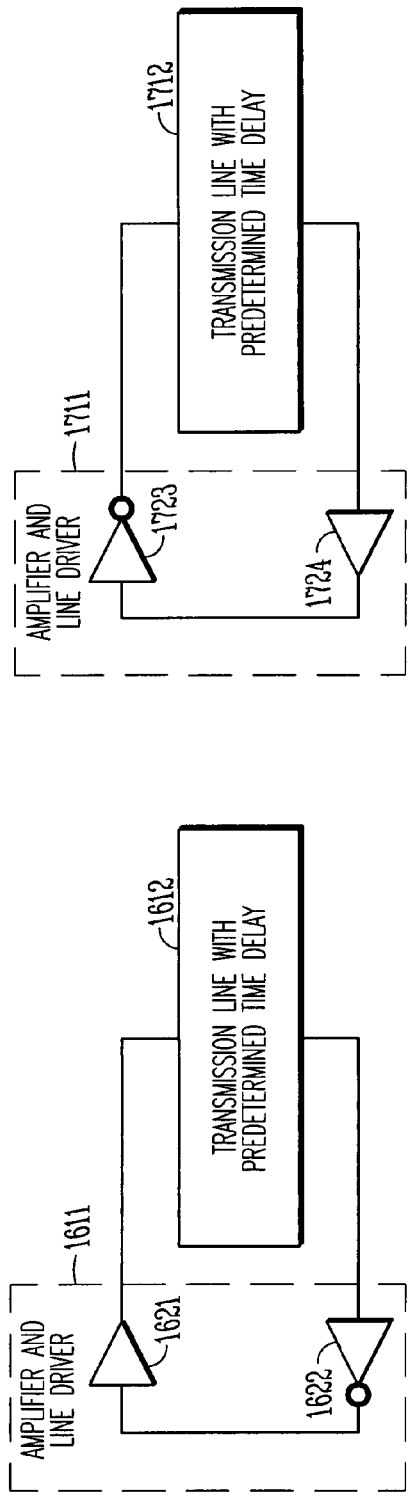
Figure 18:
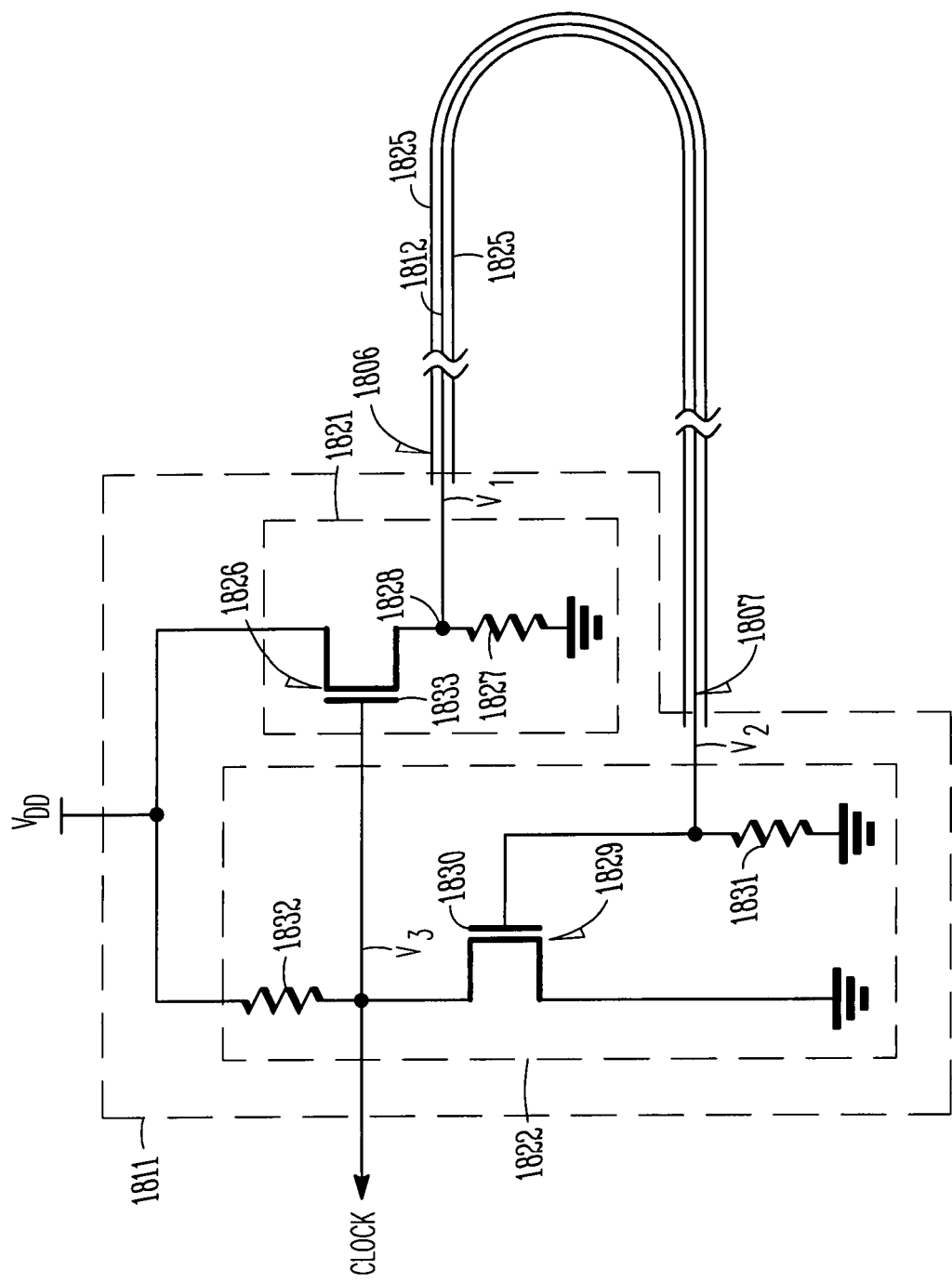
FIG. 18 illustrates an oscillator whose frequency of oscillation is determined by the signal propagation or delay time of a transmission line on an integrated circuit.

FIGS. 16 and 17 illustrate embodiments of an amplifier and line driver within a time delay oscillator. The amplifier and line driver circuit functions to receive a signal at an input node from a first end of the transmission line, and drive the transmission line with an inverted signal at an output node through the second end of the transmission line. The amplifier and line driver can be divided into a line driver and a receiver. In order to oscillate the transmission, one of the line driver and the receiver is a non-inverting amplifier and the other is an inverting amplifier. For example, FIG. 16 illustrates an amplifier and line driver 1611 with a non-inverting line driver 1621 connected to a first end of the transmission line 1612, and an inverting amplifier 1622 connected to a second end of the transmission line 1612, and to the input of the non-inverting line driver 1621. In various embodiments, as will be described in more detail below, the non-inverting line driver includes an NMOS transistor connected as a source follower, and the inverting amplifier includes an NMOS transistor connected as a common source amplifier. FIG. 17 illustrates an amplifier and line driver 1711 with an inverting line driver 1723 connected to a first end of the transmission line 1712, and a non-inverting amplifier 1724 connected to a second end of the transmission line 1712, and to the input of the inverting line driver 1723. HCx FIG. 18 illustrates an oscillator whose frequency of oscillation is determined by the signal propagation or delay time of a transmission line on an integrated circuit. In various embodiments, the transmission line is a copper line 1812 embedded in an oxide insulator over a metal ground plane 1825. In the illustrated embodiment, the line is one centimeter long, has an inductance of 2 nanohenries, a capacitance of two picofarads, and a characteristic impedance of 32 ohms (Equation 15 and 16 reflecting a geometrical factor ln(4h/d) of about 1 and reduced by a factor of 2 due to the silicon oxide dielectric). The time delay of a signal on the line is about 63 picoseconds. The line is terminated on the sending end by a 32 ohm resistor that is approximately the same as the characteristic impedance of the line, and is terminated on the receiving end by a large resistor or effectively an open circuit. The sending end low impedance is driven by a source follower 1821 functioning as a non-inverting driver, and a common source amplifier 1822 functioning as an inverting amplifier is connected to the receiving end. The illustrated source follower 1821 includes an NMOS transistor 1826 with a drain connected to a power line $V_{DD}$ and a source connected to ground through a resistor 1827. The source node 1828 forms the output of the amplifier and line driver 1811, and is connected to the input end 1806 of the transmission line 1812. The illustrated common source amplifier 1822 includes an NMOS transistor 1829 with a gate 1830 connected to an output end 1807 of the transmission line 1812 and connected to ground through a resistor 1831. The transistor includes a source connected to ground and a drain connected to the power line $V_{DD}$ through a resistor 1832. The drain node of the transistor 1829 is connected to the gate 1833 of transistor 1826. Since the drain node of transistor 1829 inverts the signal received at the gate 1830, the potential at gate 1833 will toggle between logic potentials.

A signal originating at the sending end when the source follower turns on and drives a current into the line is received sometime later at the receiving end. This latter signal is inverted and amplified, and used to drive the source follower. Inversion of the signal turns off the source follower and the total delay determines the length of one half of the period of oscillation. The negative going signal travels down the line and at a later time appears back at the amplifier. The amplifier turns on the source follower and completes one period of the oscillation.

Figure 19:
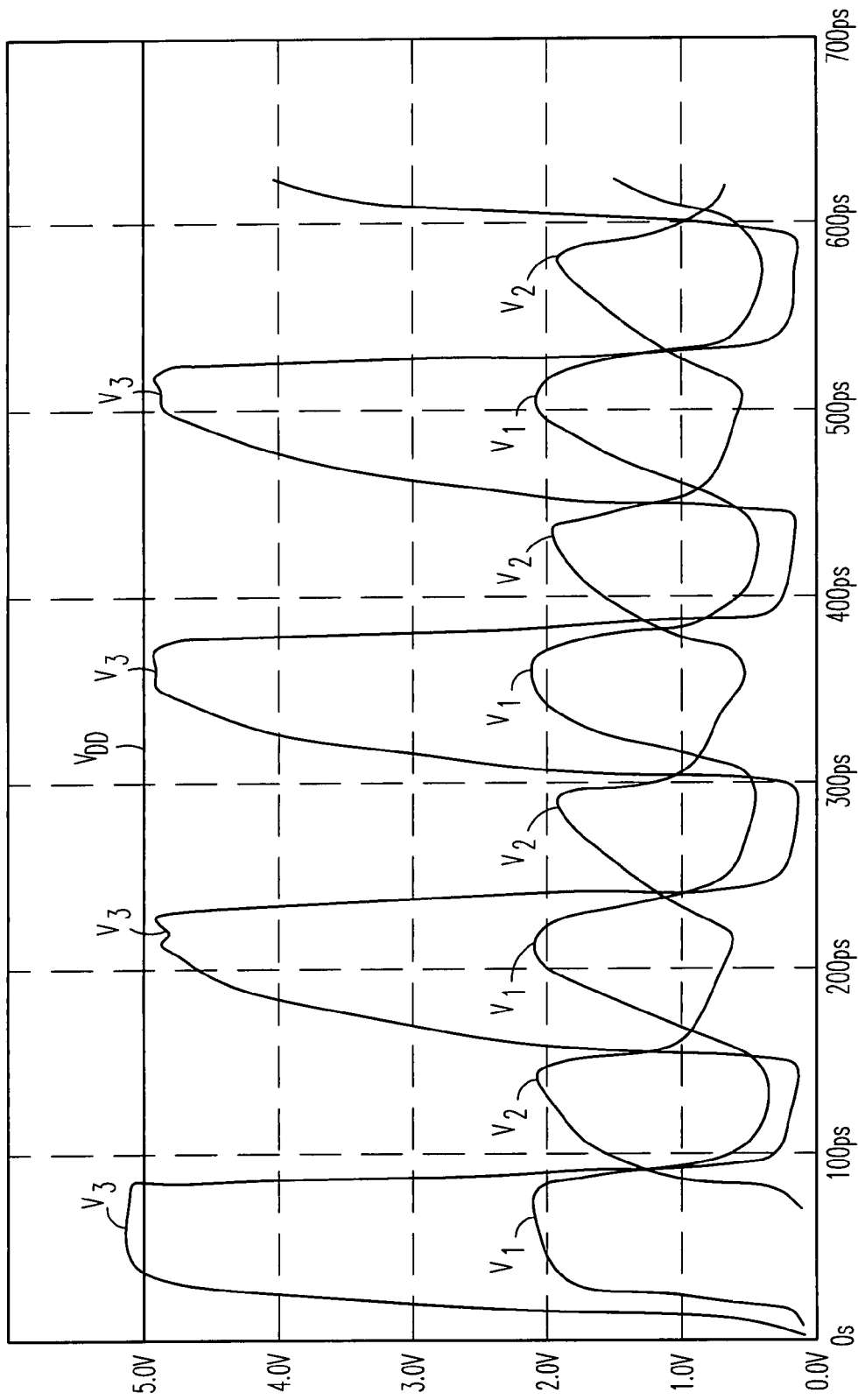
FIG. 19 illustrates a circuit simulation of the oscillation for FIG. 18.

FIG. 19 illustrates a circuit simulation of the oscillation. The illustrated circuit simulation used a $V_{DD}$ of 5 volts. Other logic potentials can be used. With reference to FIG. 18, the illustration plots the potential at the output of the source follower ($V_1$), the input of the common source amplifier ($V_2$) and the input to the gate of the common source follower ($V_3$). The frequency of oscillation is determined by the signal delay or propagation time down the transmission line on the integrated circuit. Note that while the frequency of oscillation of a ring oscillator is quite dependent of transistor characteristics (that may be highly variable), the frequency of oscillation of the time delay oscillator can be accurately established by the length of the transmission line and is much less affected by transistor characteristics.

The time delay oscillator can also be described as a T-line oscillator since the transmission line is an open circuited T-line. A quarter wavelength T-line is often used at a branching point in microwave circuits to provide a specific impedance at the location of the branching point of the lines.

Figure 20:
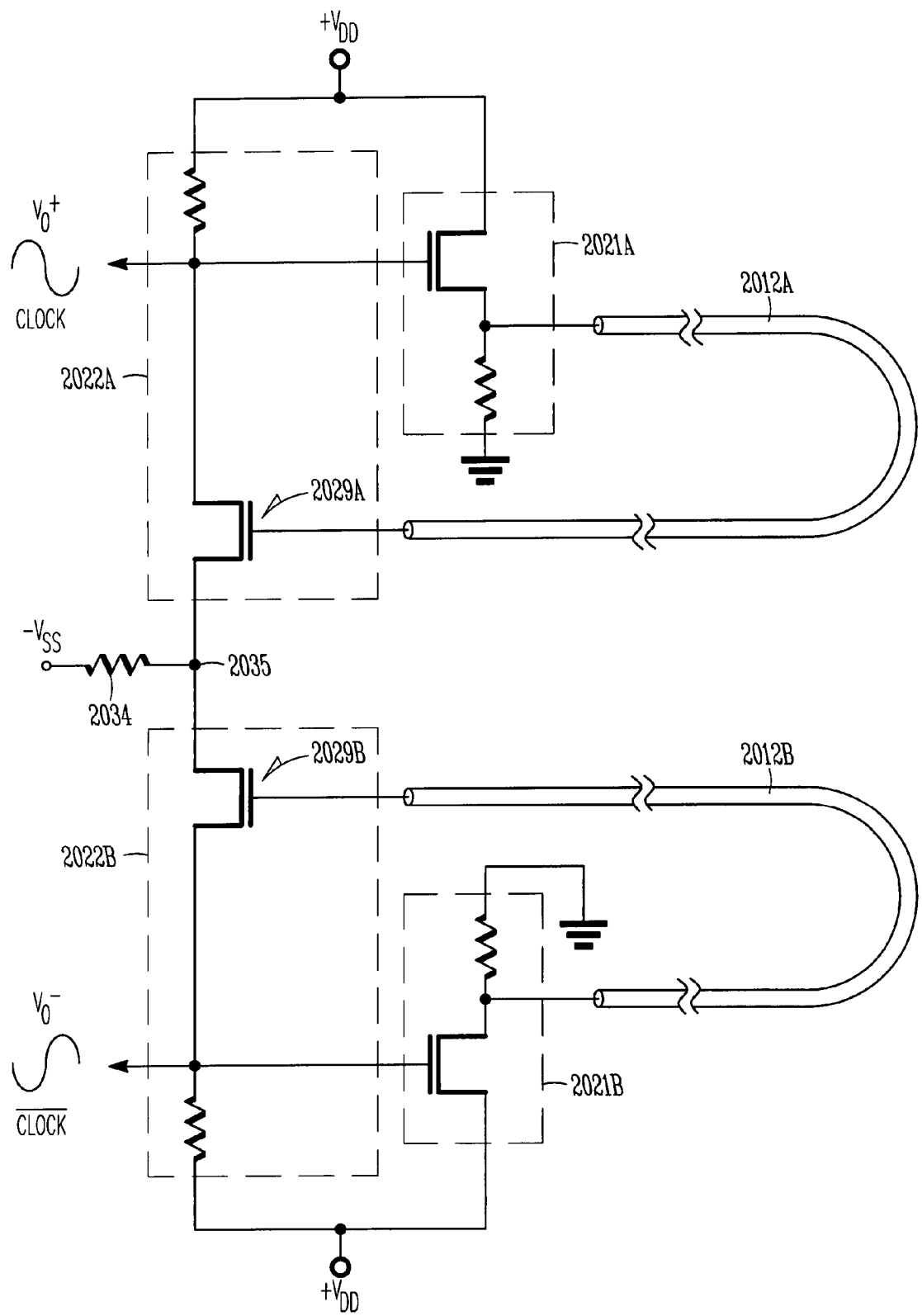
FIG. 20 illustrates an embodiment of a differential T-line oscillator.
Figure 21:
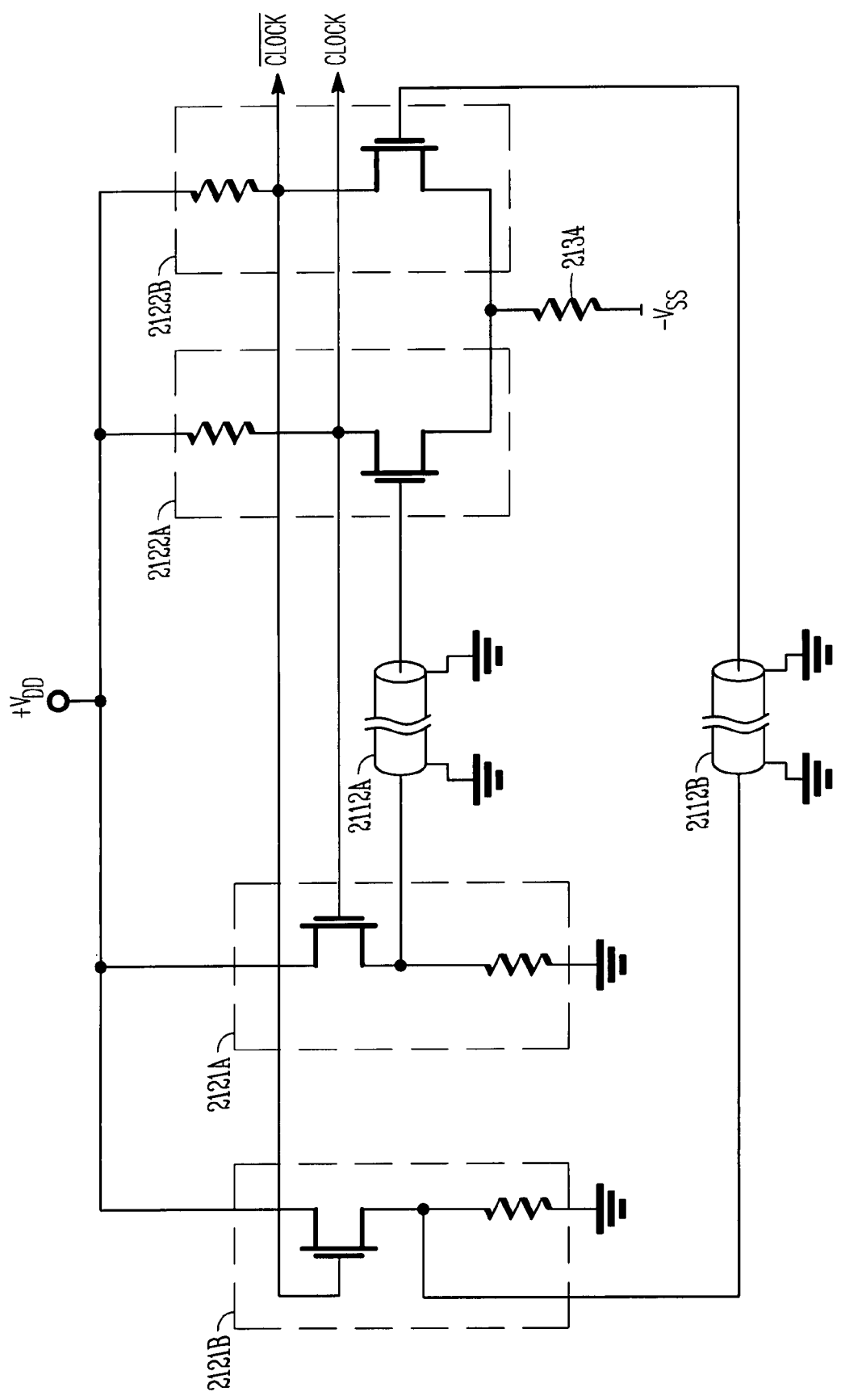
FIG. 21 illustrates the circuit diagram in a more conventional manner in which the differential amplifier configuration is more obvious.

FIG. 20 illustrates an embodiment of a differential T-line oscillator. In this embodiment, a differential amplifier is used rather than the single amplifier in the previous embodiment. The differential amplifier has twice the voltage gain. Thus, the signal drive into one of the transmission lines of the T-line oscillator can be twice as small or only one fourth the power. The overall power for this differential T-line oscillator compared to the single oscillator in FIG. 18 is reduced by a factor of two. The differential configuration includes a first transmission line 2012A associated with a first source follower 2021A and a first common source amplifier 2022A, and further includes a second transmission line 2012B associated with a second source follower 2021B and a second common source amplifier 2022B. The differential configuration will also reject noise and coupling from other circuits and substrate noise which modulate the oscillator and cause phase noise on the oscillation signal. In integrated circuits, two complementary clock signals (clock and /clock) are often required. The differential configuration includes a resistor 2034 connected between a substrate voltage $V_{SS}$ and node 2035 that connects the sources of transistor 2029A and 2029B. When one of the transistors is conducting, the current will flow through resistor 2034 raising the potential at node 2035, which reduces the gate to source voltage for the other transistor. Thus, one of the transistor 2022A and 2022B will be conducting while the other does not, which results in the complementary clock signals. These complementary clock signals are available in the differential oscillator as outputs, $V_O^+$ and $V_O^-$ in the illustrated figure. FIG. 21 illustrates the circuit diagram in a more conventional manner in which the differential amplifier configuration is more obvious. Components labeled 21xx in FIG. 21 correspond to components labeled 20xx in FIG. 20.

Methods of Formation

Figure 22:
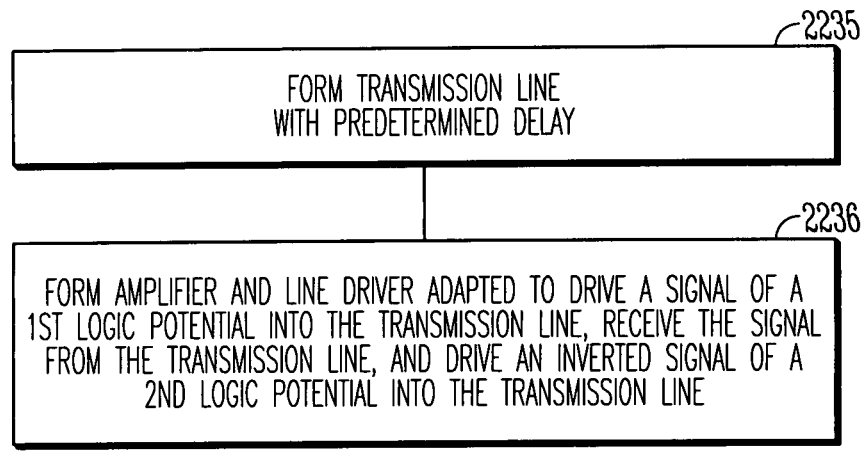
FIG. 22 illustrates an embodiment of a method for forming a time delay oscillator.

FIG. 22 illustrates an embodiment of a method for forming a time delay oscillator. It is noted that this disclosure includes several processes, circuit diagrams, and structures, and that the present subject matter is not limited to a particular process order or logical arrangement. Those of ordinary skill in the art will understand, upon reading and comprehending this disclosure, other methods of formation. With reference to FIG. 22, a transmission line with a predetermined delay is formed at 2235. An amplifier and line driver are formed at 2236, where the amplifier and line driver circuit is adapted to drive a signal of a first logic level potential into the transmission line, receive the signal from the transmission line and drive an inverted signal of a second logic potential into the transmission line. The delay of the transmission line is attributable to the propagation constant ($\gamma$) and the length of the line. The propagation constant ($\gamma$) is dependent upon the inductance and capacitance of the line. Changes to the height and/or diameter of the line, and/or changes to the surrounding dielectric can affect the propagation constant. Thus, given a number of constants, one or more variables (such as the length of the line) can be determined to engineer the transmission line with the desired transmission delay. According to various embodiments, forming a transmission line includes adjusting a resistance of the line to be approximately equal to $(4L/C)^{1/2}$. According to various embodiments, the amplifier and line driver can include a non-inverting driver at a first end of the transmission line and an inverting amplifier at a second end of the transmission line, where the output of the inverting amplifier is fed to the input of the non-inverting driver. According to various embodiments, the amplifier and line driver can include an inverting driver at a first end of the transmission line and a non-inverting amplifier at a second end of the transmission line, where the output of the non-inverting amplifier is fed to the input of the inverting driver. Other methods of formation are provided herein.

Methods of Operating

Figure 23:
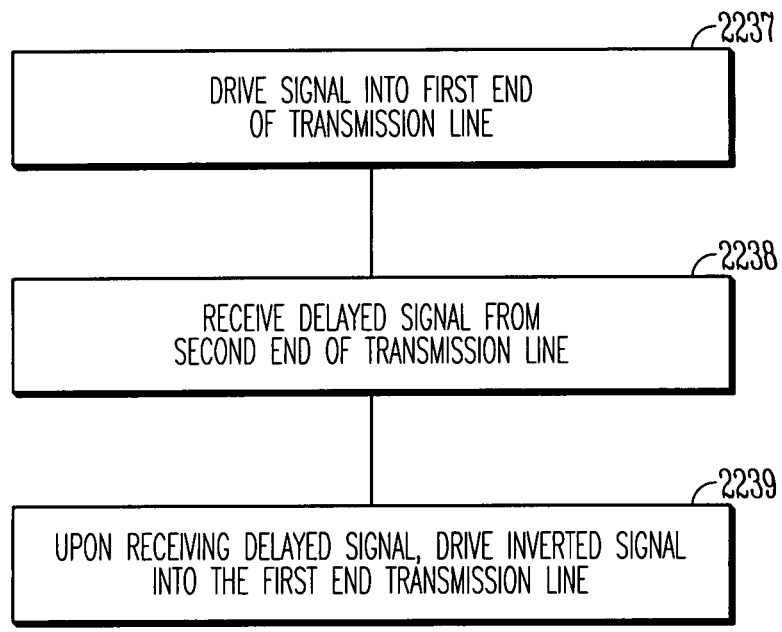
FIG. 23 illustrates an embodiment of a method for operating a time delay oscillator.

FIG. 23 illustrates an embodiment of a method for operating a time delay oscillator. It is noted that this disclosure includes several processes, circuit diagrams, and structures, and that the present subject matter is not limited to a particular process order or logical arrangement. Those of ordinary skill in the art will understand, upon reading and comprehending this disclosure, other methods of operation contained herein. With reference to FIG. 23, a signal is driven into a first end of a transmission line at 2337, a delayed signal is received from a second end of the transmission line at 2338, and as illustrated at 2339 the inverted signal is driven into the first end of the transmission line upon receiving the delayed signal. The clock can be taken from the ends of the transmission line according to some embodiments. Some embodiments provide clock signals from taps along the transmission line. Other methods of operating are provided herein.

Wafer and System Levels

In the following description, the terms "wafer" and "substrate" are used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

Figure 24:
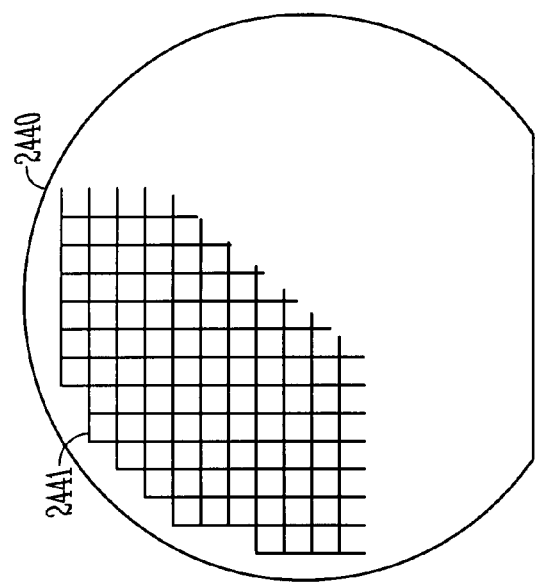
FIG. 24 illustrates a wafer, upon which the time delay oscillator can be fabricated according to embodiments of the present subject matter.

FIG. 24 illustrates a wafer 2440, upon which the time delay oscillator can be fabricated according to embodiments of the present subject matter. A common wafer size is 8 inches in diameter. However, wafers are capable of being fabricated in other sizes, and the present subject matter is not limited to wafers of a particular size. A number of dies can be formed on a wafer. A die 2441 is an individual pattern, typically rectangular, on a substrate that contains circuitry to perform a specific function. A semiconductor wafer typically contains a repeated pattern of such dies containing the same functionality. A die is typically packaged in a protective casing (not shown) with leads extending therefrom (not shown) providing access to the circuitry of the die for communication and control.

Figure 25:
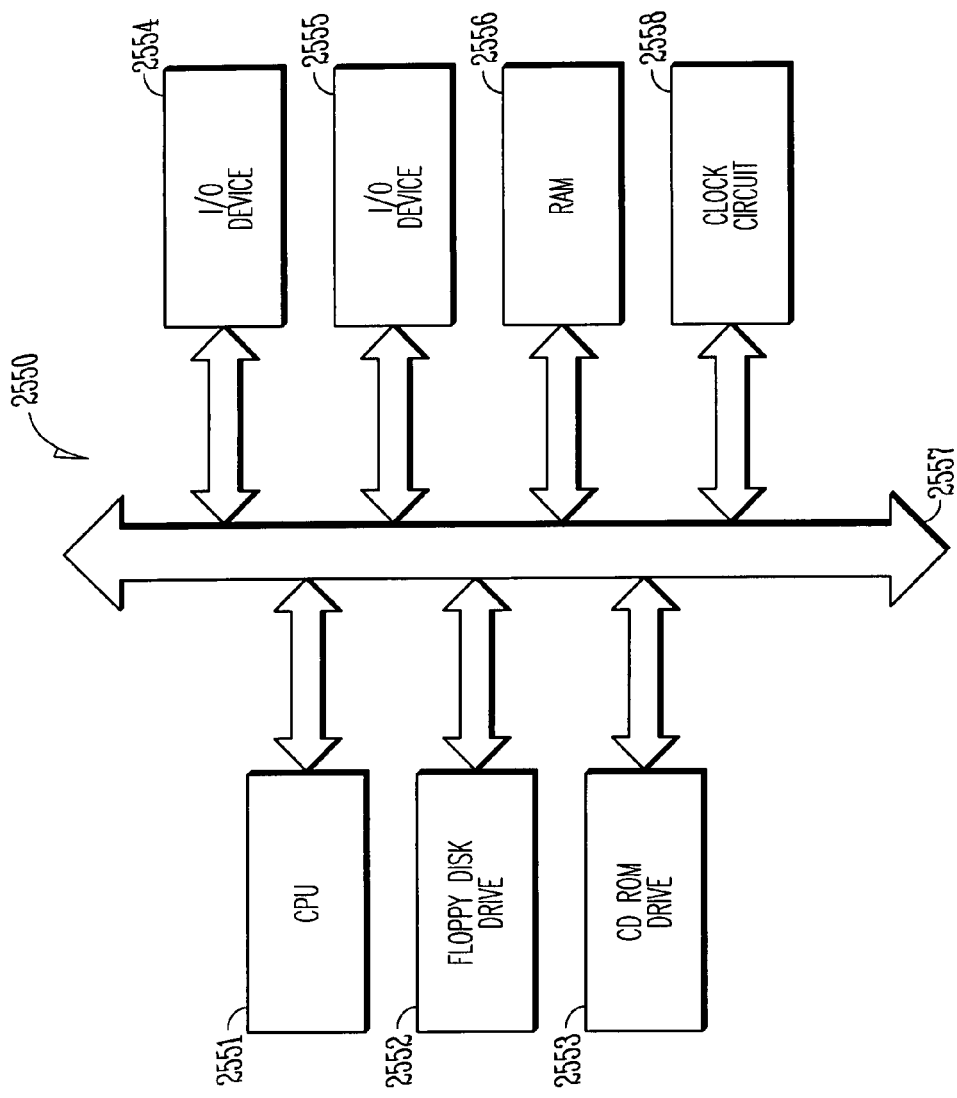
FIG. 25 illustrates a processor-based system which includes a time delay oscillator according to the present subject matter.

FIG. 25 illustrates a processor-based system which includes a time delay oscillator according to the present subject matter. The processor-based system 2550, such as a computer system, for example, generally comprises a central processing unit (CPU) 2551, for example, a microprocessor, that communicates with one or more input/output (I/O) devices 2554, 2555 (including USB connected devices, for example) over a bus 2557. The computer system 2550 also includes random access memory (RAM) 2556 and/or read only memory (ROM) and/or Flash memory, and in the case of a computer system may include peripheral devices such as a floppy disk drive 2552 and a compact disk (CD) ROM drive 2553 and/or DVD device which also communicate with CPU 2551 over the bus 2557. Generally such an electronic system 2550 will have a native set of instructions that specify operations to be performed on data by the processor 2551 and other interactions between the processor, the memory device and the I/O devices. The illustrated system 2550 includes a clock circuit 2558, which can include the time-delay oscillator described herein.

Figure 26:
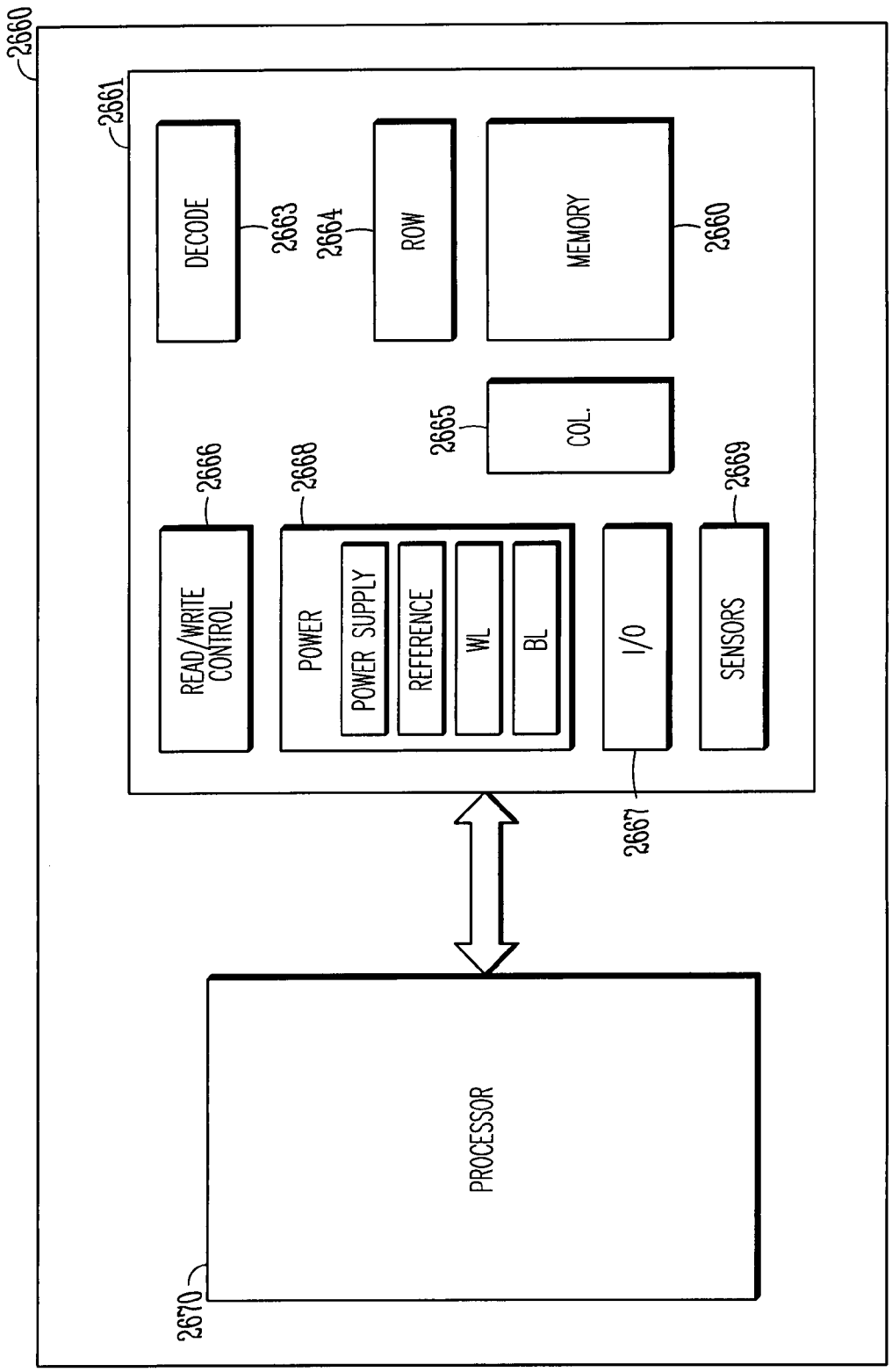
FIG. 26 illustrates a simplified block diagram of a high-level organization of an electronic system that includes time delay oscillators, according to various embodiments.

FIG. 26 illustrates a simplified block diagram of a high-level organization of an electronic system that includes time delay oscillators, according to various embodiments. The system 2660 includes a memory device 2661 which has an array of memory cells 2662, address decoder 2663, row access circuitry 2664, column access circuitry 2665, read/write control circuitry 2666 for controlling operations, and input/output circuitry 2667. The memory device 2661 further includes power circuitry 2668, and sensors 2669 for determining the state of the memory cells. The illustrated power circuitry 2668 includes power supply circuitry, circuitry for providing a reference voltage, circuitry for providing the word line with pulses, and circuitry for providing the bit line with pulses. Also, as shown in FIG. 26, the system 2660 includes a processor 2670, or memory controller for memory accessing. The memory device receives control signals from the processor over wiring or metallization lines. The memory device is used to store data which is accessed via I/O lines. It will be appreciated by those skilled in the art that additional circuitry and control signals can be provided, and that the memory device has been simplified. At least one of the processor or memory device includes a time delay oscillator according to the present subject matter.

The illustration of system 2660 is intended to provide a general understanding of one application for the structure and circuitry of the present subject matter, and is not intended to serve as a complete description of all the elements and features of an electronic system. As one of ordinary skill in the art will understand, such an electronic system can be fabricated in single-package processing units, or even on a single semiconductor chip, in order to reduce the communication time between the processor and the memory device.

Applications containing time delay oscillators, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a cell phone, a personal computer, a personal digital assistant, an automobile, an industrial control system, and others.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method, comprising:
    forming a driver with an input and with an output, including forming one of either an inverting amplifier or a non-inverting amplifier to form the driver;
    forming a receiver with an input and with an output connected to the input of the driver, including forming the other one of the inverting amplifier or the non-inverting amplifier to form the receiver;
    forming a transmission line having a predetermined length and a predetermined propagation constant, wherein:
        the transmission line has a first end connected to the output of the driver and a second end connected to the input of the receiver; and
        the driver, the receiver and the transmission line are configured to:
            provide a single signal path from the output of the driver through the transmission line to the input of the receiver and from the output of the receiver to the input of the driver; and
            transmit an oscillating signal through the signal path.

2. The method of claim 1, further comprising forming at least one clock tap on the signal path, wherein the oscillating signal is used to generate a clock signal.

3. The method of claim 2, wherein forming at least one clock tap includes:
    forming a clock tap at a first node between the output of the receiver and the input of the driver; or
    forming at least one clock tap on the transmission line.

4. The method of claim 3, wherein forming at least one clock tap on the signal path includes forming a phase shift network to adjust the clock phase of the clock signal.

5. The method of claim 4, wherein forming the phase shift network includes forming an RC network with an adjustable resistance (R) and a capacitance (C), wherein the adjustable resistance includes a transistor configured as a voltage variable resistor.

6. The method of claim 1, wherein:
    forming the transmission line includes forming the transmission line with a line resistance approximately equal to $(4 \, L/C)^{1/2}$; and
    L is the inductance of the transmission line and C is the capacitance of the transmission line.

7. The method of claim 1, wherein:
    forming the inverting amplifier includes forming a common source amplifier; and
    forming the non-inverting amplifier includes forming a source follower amplifier.

8. The method of claim 1, further comprising forming a differential oscillator, wherein:
    forming a driver includes forming a first driver, forming a receiver includes forming a first receiver, forming a transmission line includes forming a first transmission line; and
    the oscillating signal through the signal path through the first transmission line is a first oscillating signal through a first signal path;
    the method further comprising:
        forming a second driver with an input and with an output, including forming one of either an inverting amplifier or a non-inverting amplifier to form the second driver;
        forming a second receiver with an input and with an output connected to the input of the driver, including forming the other one of the inverting amplifier or the non-inverting amplifier to form the second receiver, wherein the first receiver and the second receiver are connected at a node;
        forming a second transmission line having a predetermined length and a predetermined propagation constant,
        wherein the second transmission line has a first end connected to the output of the second driver and a second end connected to the input of the second receiver; and the second driver, the second receiver and the second transmission line are configured to:
            provide a single second signal path from the output of the second driver through the second transmission line to the input of the second receiver and from the output of the second receiver to the input of the second driver; and
            transmit a second oscillating signal through the signal path, where the second oscillating signal is complementary to the first oscillating signal.

9. The method of claim 1, wherein forming a transmission line having a predetermined length includes adjusting a length of the transmission line to provide the predetermined length using a programmable element.

10. A method for producing a clock signal of a predetermined oscillation, comprising:
    oscillating a signal through a transmission line with a predetermined transmission signal time delay, including:
        driving the signal into a first end of a transmission line using a driver with an output connected to the first end of the transmission line;

receiving a delayed signal from a second end of the transmission line using a receiver with an input connected to the second end of the transmission line, wherein the receiver has an output, and the driver has an input connected to the output of the receiver at a first node; and upon receiving the delayed signal, driving an inverted signal into the first end of the transmission line using the driver; and distributing a clock signal generated from the oscillating signal, including:

distributing the clock signal from the first node; or distributing the clock signal from at least one clock output node on the transmission line.

11. The method of claim 10, wherein distributing a clock signal includes both distributing a first clock signal from the first node and distributing at least a second clock signal from at least one clock output node on the transmission line.

12. The method of claim 10, wherein distributing the signal from at least one clock output node on the transmission line includes shifting a phase of the signal transmitted through the transmission line.

13. The method of claim 12, wherein shifting the phase includes using an RC network or an inverter to shift the phase, wherein the RC network includes a variable capacitance (C) and a variable resistance (R) configured for use in controlling the phase.

14. The method of claim 10, further comprising distributing the clock signal using a clock distribution structure selected from the group consisting of: an H-tree clock distribution structure; a grid clock distribution structure; a balanced tree clock distribution structure; and a balanced tree clock distribution structure with buffers.

15. An oscillator, comprising:

a first oscillating circuit to provide a first clock output, including:

a first transmission line with a predetermined transmission signal time delay, the first transmission line having a first end and a second end;

a first driver with an input and an output connected to the first end of the first transmission line;

a first receiver with an input connected to the second end of the first transmission line and an output connected to the input of the first driver; and wherein one of the first driver and the first receiver includes a non-inverting amplifier and the other of the first driver and the first receiver includes an inverting amplifier; and a second oscillating circuit to provide a second clock output complementary to the first clock output, including:

a second transmission line with a predetermined transmission signal time delay, the second transmission line having a first end and a second end;

a second driver with an input and an output connected to the first end of the second transmission line;

a second receiver with an input connected to the second end of the second transmission line and an output connected to the input of the second driver;

wherein one of the second driver and the second receiver includes a non-inverting amplifier and the other of the second driver and the second receiver includes an inverting amplifier; and wherein the first receiver and the second receiver share a node that is connected to a substrate voltage through a resistor.

16. The oscillator of claim 15, wherein each of the first and second transmission lines has a predetermined line resistance of approximately $(4 L/C)^{1/2}$, wherein L is the transmission line inductance and C is the transmission line capacitance.

17. The oscillator of claim 15, further comprising:

a first clock output at a first node between the output of the first receiver and the input of the first driver; and a second clock output complementary to the first clock output at a second node between the output of the second receiver and the input of the second driver.

18. The oscillator of claim 15, further comprising at least one clock tap on the first transmission line and at least one clock tap on the second transmission line.

19. The oscillator of claim 18, further comprising a phase shift network connected to at least one of the clock taps on either the first or second transmission lines.

20. The oscillator of claim 15, wherein the inverting amplifier includes a common source amplifier and the non-inverting amplifier includes a source follower amplifier.

21. A clock system, comprising:

at least one oscillator, including:

an amplifier and line driver with an input and an output, the output to produce an inverted signal with respect to a signal received at the input;

a transmission line with a predetermined transmission signal time delay, the transmission line having a first end connected to the output and a second end connected to the input, the transmission line having a capacitance (C), an inductance (L), and a resistance of about $(4L/C)^{1/2}$; and a clock signal output node; and a clock distribution structure connected to the clock signal output node of the oscillator to distribute at least one clock signal.

22. The system of claim 21, wherein the clock distribution system is selected from a group of distribution systems consisting of: an H tree clock distribution structure, a grid clock distribution structure, a balanced tree clock distribution structure; and a balanced tree clock distribution structure with buffers.

23. The system of claim 21, wherein the clock distribution system includes a plurality of clock taps on the transmission line to provide a plurality of clock output nodes, each of the plurality of clock taps including a phase shift network adapted to provide a clock phase synchronized with other clock phases on the other clock output nodes.

24. The system of claim 23, wherein the phase shift network includes a voltage-variable resistor.

* * * * *